US011777029B2

(12) United States Patent
Haratipour et al.

(10) Patent No.: US 11,777,029 B2
(45) Date of Patent: Oct. 3, 2023

(54) VERTICAL TRANSISTORS FOR ULTRA-DENSE LOGIC AND MEMORY APPLICATIONS

(71) Applicant: Intel Corporation, Santa Clara, CA (US)

(72) Inventors: Nazila Haratipour, Hillsboro, OR (US); I-Cheng Tung, Hillsboro, OR (US); Abhishek A. Sharma, Hillsboro, OR (US); Arnab Sen Gupta, Beaverton, OR (US); Van Le, Beaverton, OR (US); Matthew V. Metz, Portland, OR (US); Jack Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 869 days.

(21) Appl. No.: 16/455,567

(22) Filed: Jun. 27, 2019

(65) Prior Publication Data
US 2020/0411686 A1    Dec. 31, 2020

(51) Int. Cl.
*H01L 29/78* (2006.01)
*H01L 29/423* (2006.01)
*H01L 29/66* (2006.01)

(52) U.S. Cl.
CPC .... *H01L 29/7827* (2013.01); *H01L 29/42364* (2013.01); *H01L 29/66666* (2013.01)

(58) Field of Classification Search
CPC ......... H01L 29/42356; H01L 29/42364; H01L 29/66666; H01L 29/7827
(Continued)

(56) References Cited

U.S. PATENT DOCUMENTS 6,140,672 A    10/2000    Arita et al.
6,339,241 B1    1/2002    Mandelman et al.
(Continued)

FOREIGN PATENT DOCUMENTS

KR    20100053230    5/2010
WO    2018182607    10/2018

OTHER PUBLICATIONS

Kim, Se-Yang, et al., "Recent Developments in Controlled Vapor-Phase Growth of Two-Dimensional Group 6 Transition Metal Dichalcogenides", Advanced Materials, vol. 31, Issue 20, Feb. 2019, 90 pgs.
(Continued)

*Primary Examiner* — Matthew E. Gordon
(74) *Attorney, Agent, or Firm* — Essential Patents Group, LLP

(57) ABSTRACT

A vertical transistor structure includes a material stack having a source material, a drain material, and a channel material therebetween. The vertical transistor structure further includes a gate electrode adjacent to a sidewall of the stack, where the sidewall includes the channel material, and at least a partial thickness of both the source material and the drain material. A gate dielectric is present between the sidewall of the stack and the gate electrode. The vertical transistor structure further includes a first metallization over a first area of the stack above the gate dielectric layer, and in contact with the gate electrode on sidewall of the stack. A second metallization is adjacent to the first metallization, where the second metallization is over a second area of the stack, and in contact with the source material or the drain material.

20 Claims, 17 Drawing Sheets

(58) Field of Classification Search
USPC .......................................................... 257/57
See application file for complete search history.

(56) References Cited

U.S. PATENT DOCUMENTS

| | | |
|---|---|---|
| 6,392,917 B1 | 5/2002 | Kang |
| 6,404,667 B1 | 6/2002 | Yoo |
| 6,700,133 B1 | 3/2004 | Ohtani et al. |
| 6,873,029 B2 | 3/2005 | He et al. |
| 7,919,800 B2 | 4/2011 | Gonzalez et al. |
| 8,258,498 B2 | 9/2012 | Majhi et al. |
| 8,395,191 B2 | 3/2013 | Or-Bach et al. |
| 9,263,527 B2 | 2/2016 | Yamada et al. |
| 9,576,960 B2 | 2/2017 | Khakifirooz et al. |
| 9,673,285 B2 | 6/2017 | Simin et al. |
| 9,705,003 B2 | 7/2017 | Yamazaki et al. |
| 9,991,268 B1 | 6/2018 | Liaw |
| 10,026,845 B2 | 7/2018 | Pillarisetty et al. |
| 10,084,058 B2 | 9/2018 | Majhi et al. |
| 10,224,279 B2 | 3/2019 | Or-Bach et al. |
| 10,312,289 B1 | 6/2019 | Ota et al. |
| 11,171,243 B2 | 11/2021 | Dewey et al. |
| 11,282,963 B2 | 3/2022 | Ahmed |
| 11,355,505 B2 | 6/2022 | Morris et al. |
| 2003/0132470 A1 | 7/2003 | Joshi et al. |
| 2005/0236622 A1 | 10/2005 | Jung et al. |
| 2007/0155067 A1 | 7/2007 | Park et al. |
| 2009/0146141 A1 | 6/2009 | Song et al. |
| 2010/0038743 A1 | 2/2010 | Lee |
| 2010/0110758 A1 | 5/2010 | Li et al. |
| 2010/0224873 A1 | 9/2010 | Sakata et al. |
| 2011/0121266 A1 | 5/2011 | Majhi et al. |
| 2011/0168993 A1 | 7/2011 | Jeon et al. |
| 2012/0003808 A1 | 1/2012 | Lee |
| 2012/0319728 A1 | 12/2012 | Madurawe |
| 2013/0264620 A1 | 10/2013 | Yu et al. |
| 2013/0292702 A1 | 11/2013 | Horii |
| 2014/0009998 A1 | 1/2014 | Schloss et al. |
| 2014/0145272 A1 | 5/2014 | Or-Bach et al. |
| 2014/0183637 A1 | 7/2014 | Cohen et al. |
| 2015/0171167 A1 | 6/2015 | Nourbakhsh et al. |
| 2015/0179786 A1 | 6/2015 | Kim et al. |
| 2015/0249096 A1 | 9/2015 | Lupino et al. |
| 2015/0255139 A1 | 9/2015 | Atsumi et al. |
| 2015/0364565 A1 | 12/2015 | Ramaswamy et al. |
| 2016/0043114 A1 | 2/2016 | Mao |
| 2016/0056039 A1 | 2/2016 | Kim et al. |
| 2016/0056249 A1 | 2/2016 | Kleemeier et al. |
| 2016/0204277 A1 | 7/2016 | Yang et al. |
| 2016/0225915 A1 | 8/2016 | Qiu et al. |
| 2016/0359062 A1 | 12/2016 | Heo et al. |
| 2016/0365372 A1 | 12/2016 | Li et al. |
| 2017/0133375 A1 | 5/2017 | Fung |
| 2017/0162702 A1 | 6/2017 | Hu |
| 2017/0200744 A1 | 7/2017 | Giles et al. |
| 2017/0358598 A1 | 12/2017 | Bedeschi |
| 2018/0130785 A1 | 5/2018 | Wang et al. |
| 2018/0226248 A1 | 8/2018 | Jahangir et al. |
| 2018/0226509 A1 | 8/2018 | Karpov et al. |
| 2019/0027535 A1 | 1/2019 | Kumar et al. |
| 2019/0267319 A1 | 8/2019 | Sharma et al. |
| 2019/0287858 A1 | 9/2019 | Dasgupta et al. |
| 2019/0371892 A1 | 12/2019 | Lee et al. |
| 2020/0098564 A1 | 3/2020 | Li et al. |
| 2020/0135921 A1* | 4/2020 | Chiang ............. H01L 29/78618 |
| 2020/0258884 A1 | 8/2020 | Rachmady et al. |
| 2020/0350440 A1 | 11/2020 | Gao et al. |
| 2020/0357814 A1 | 11/2020 | Kim et al. |
| 2022/0052200 A1 | 2/2022 | Dewey et al. |

OTHER PUBLICATIONS

Zubko, P., et al., "Ferroelectric Domains in PbTiO3/SrTiO3 Superlattices", FERROELECTRICS, vol. 433, No. 1, Sep. 12, 2012, pp. 127-137.

* cited by examiner

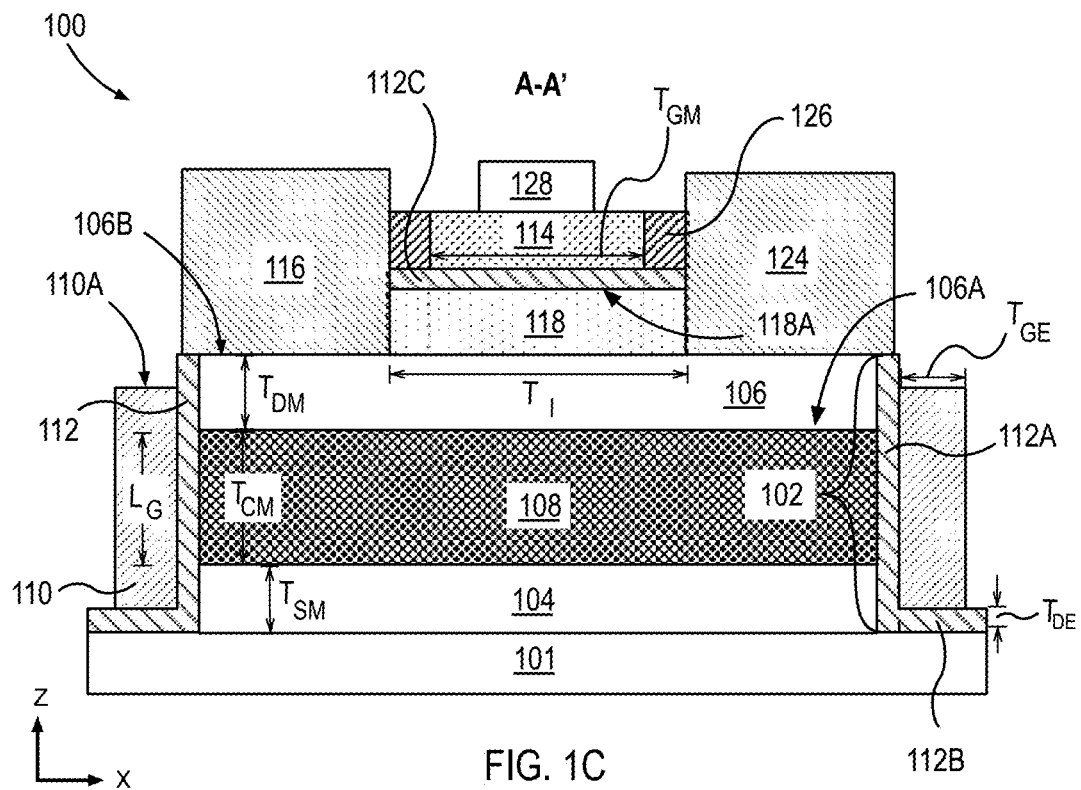
FIG. 1C
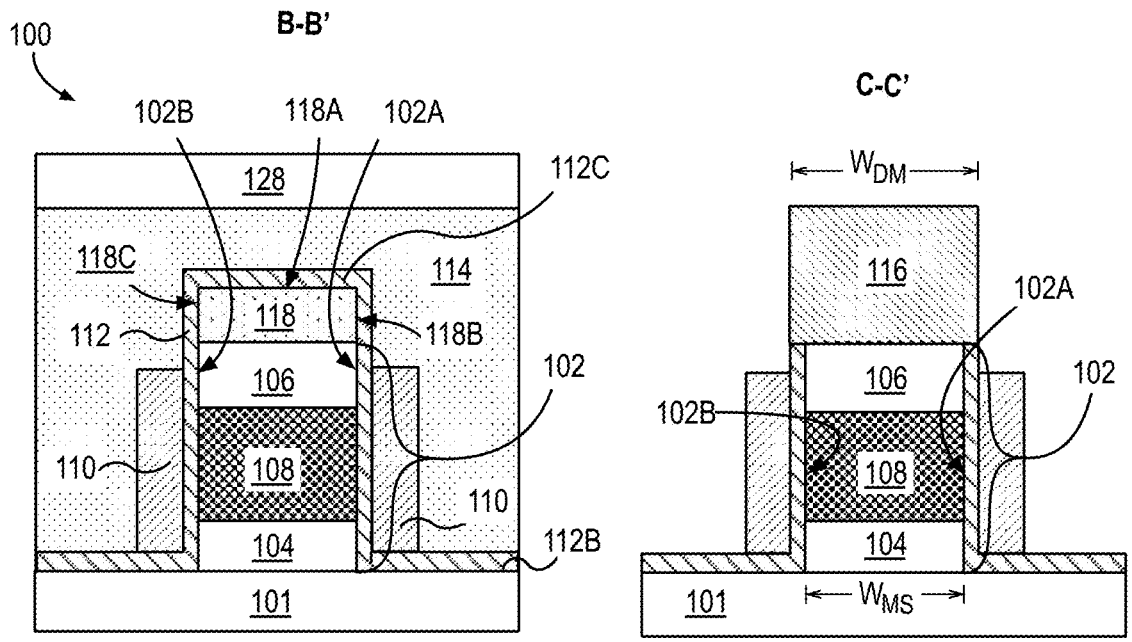
FIG. 1D
FIG. 1E

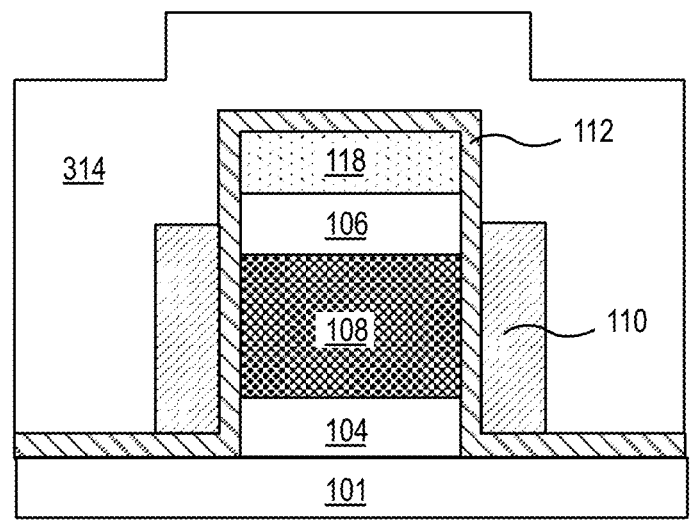
FIG. 5A
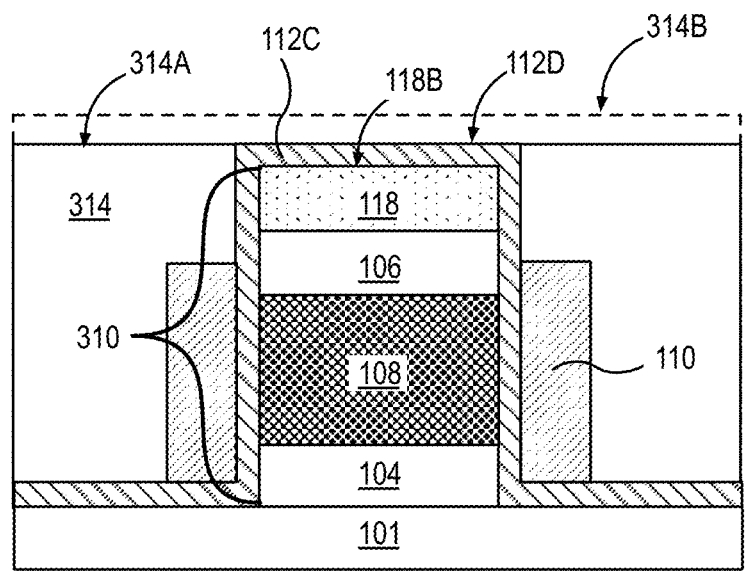
FIG. 5B

A-A'

VERTICAL TRANSISTORS FOR ULTRA-DENSE LOGIC AND MEMORY APPLICATIONS

BACKGROUND

High performance transistors may utilize materials other than silicon for channel Such transistors may have limitations for reducing resistance between drain and gate, for example during, operation.

Therefore, there is a continuing need for transistors with reduced off state current and increased drive current in the on state. It is with respect to these and other considerations that the present improvements are needed. Such improvements may become necessary as the desire for improved transistor performance becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1C illustrates a cross-sectional view along a longitudinal axis of the vertical transistor.

FIG. 1D illustrates a cross-sectional view along an axis perpendicular to the longitudinal axis of the vertical transistor.

FIG. 1E illustrates a cross-sectional view across a drain contact of the vertical transistor in a direction perpendicular to the longitudinal axis of the vertical transistor.

FIG. 5A illustrates the structure of FIG. 4B following the formation of a first dielectric material on the gate dielectric layer and on the gate electrode.

FIG. 5B illustrates the structure of FIG. 5A following the process of planarization of the first dielectric material.

FIG. 10B illustrates a cross-sectional view along a longitudinal axis (line A-A') in

FIG. 10A.

DESCRIPTION OF THE EMBODIMENTS

Figure 1A:
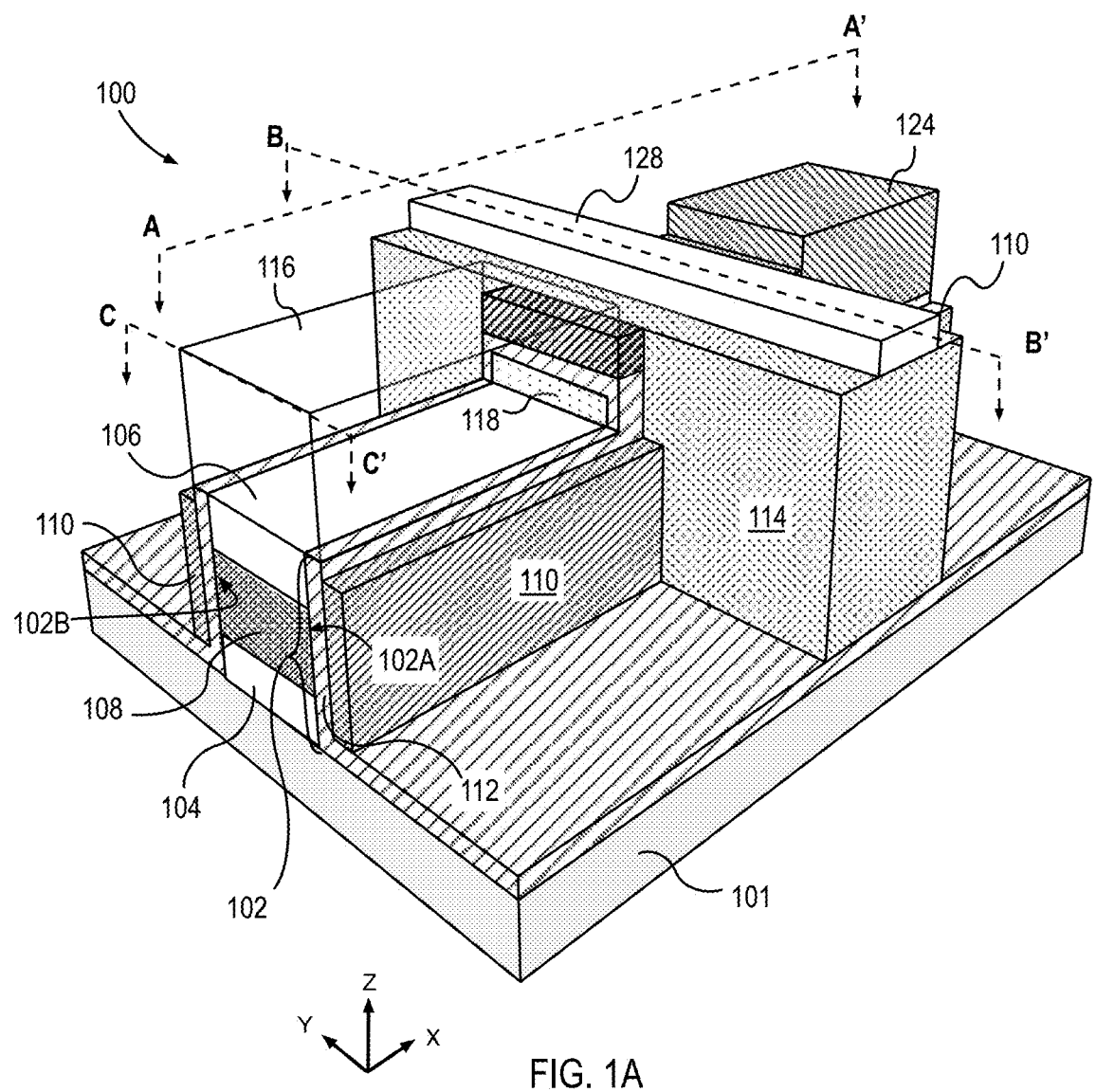
FIG. 1A illustrates an isometric view of a vertical transistor including a surround gate and a channel including an amorphous or polycrystalline material, in accordance with an embodiment of the present disclosure.

Vertical transistor for ultra-dense logic and memory application and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Vertical transistors may be implemented to enable scaling of device footprint. A vertical transistor includes stacked source, channel, and drain regions, where the gate electrode extends along a vertical direction. Such transistors may include various shapes such as cylindrical, square or rectangular blocks. Vertical transistors may be advantageous as the channel length in a vertical transistor is determined by a vertical thickness of the channel material. A vertical thickness may be beneficial because expansion in a vertical direction helps to reduce footprint over a horizontal portion of a substrate. Vertical transistors can provide a compact architecture, enable increasing number density of transistors in a given area of a substrate, and decouple Lg scaling from the cell area.

As transistors are scaled in size, optimizing transistor drive current while operating the transistor at low voltages is highly desirable. Low voltage operation may lend to power savings. For example, one method to increase the drive current is to thin the gate dielectric layer as the drive current is inversely proportional to the thickness of the gate dielectric. However, thinning of gate dielectric layer can also lead to an increase in leakage current as electrons can tunnel through a thin gate dielectric layer. The drive current of a transistor may also be increased by increasing the gate voltage on the transistor, in conjunction with increasing the drain bias voltage with respect to the source. However, this can lead to increased power consumption, source-drain leakage and gate leakage.

The drive current may be increased by implementing a channel material different from conventional CMOS materials that is usually single crystal silicon or germanium in the vertical transistor. Such channel materials, for example, polycrystalline silicon or amorphous germanium doped with oxygen, fluorine, chlorine etc. can provide excess charge to the channel without additionally increasing the gate or drain voltage. When such a vertical transistor also includes source and drain structures that are metallic, the transistor may suffer high external electrical resistance when the gate electrode does not overlap with the source and drain structure. However, this situation may be mitigated by at least partially overlapping the gate with a portion of both the source and the drain.

In accordance with an embodiment of the present disclosure, a vertical transistor structure includes a material stack having, a source material, a drain material, and a channel material between the source and drain materials. The channel material may include an amorphous, polycrystalline, or monocrystalline semiconductor. The source and drain material may include a highly electrically conductive material for example, a metal, an alloy or a conductive oxide. The source and drain include a different material from the channel material. The source and drain can both include a same or a different material. The material stack may in general have a rectangular geometry to improve transistor features such as a higher drive current for example. The vertical transistor structure further includes a gate electrode adjacent to a sidewall of the stack, where the sidewall includes the channel material, and at least a partial thickness of both the source material and the drain material. By overlapping the gate electrode with a partial thickness of both the source material and the drain material, the vertical transistor can operate with significantly reduced external electrical resistance compared to where is no overlap. The structure also allows for independent selection of source and drain materials promoting asymmetry where needed.

A gate dielectric is present between the sidewall of the stack and the gate electrode. The gate dielectric layer is also on a portion of an uppermost surface of the stack. The vertical transistor structure further includes a first metallization over a first area of the stack above the gate dielectric layer, and in contact with the gate electrode on sidewall of the stack. A second metallization is adjacent to the first metallization, where the second metallization is over a second area of the stack, and in contact with the source material or the drain material. The second metallization is separated from the first metallization by at least one insulator material to prevent electrical shorting.

FIG. 1A illustrates an isometric view of a transistor 100 above a substrate 101, in accordance with an embodiment of the present disclosure. In an exemplary embodiment, the vertical transistor 100 includes a material stack 102 having, a source material 104, a drain material 106, and a channel material 108 therebetween. The material stack 102 may in general have a rectangular geometry, as shown to improve transistor features such as a higher drive current, for example. The vertical transistor 100 further includes a gate electrode 110 adjacent to a sidewall of the stack 102, where the sidewall includes the channel material 108, and at least a partial thickness of the source material 104 and a partial thickness of the drain material 106. By overlapping the gate electrode 110 with a partial thickness of both the source material 104 and the drain material 106, the vertical transistor 100 can operate with significantly reduced external electrical resistance. External electrical resistance is reduced because charges can travel between the metallic source material 104, channel material 108 and metallic drain material 106 because of a continuous gated overlap between the three regions. The continuous gate overlap prevents additional barrier height for the charges.

The vertical transistor 100 further includes a gate dielectric 112 between the sidewall of the stack 102 and the gate electrode 110. The vertical transistor structure 100 further includes a metallization structure 114 (herein after gate metallization 114) over a first area of the stack in contact with a portion of the gate electrode 110 directly adjacent to the gate dielectric layer 112. A metallization 116 (herein after drain metallization 116) is adjacent to the gate metallization 114, where the drain metallization 116 is over a second area of the stack 102, and in contact with the drain material 106. The drain metallization 116 is insulated from the gate metallization 114 by an insulator 118, and by the gate dielectric layer 112 to prevent electrical shorting. The gate metallization 114 is further coupled to a gate interconnect structure 128 that extends along the Y-axis parallel to the gate metallization 114. The gate interconnect structure 128 may extend beyond the gate metallization 114 in the Y-direction in the Figure.

The vertical transistor 100 operates on the principle similar to a silicon MOSFET transistor where an inversion region is created in the channel 108 when there is a voltage applied on the gate electrode 110 relative to the source material 104. In an embodiment, the channel material 108 includes an amorphous, polycrystalline or a crystalline semiconductor. Specific examples of the channel material include amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, black phosphorus, indium antimonide, graphene, graphyne, borophene, germanene, silicene, Si2BN, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), zinc oxide, aluminum doped zinc oxide and transition metal chalcogenides for example, sulphur and at least one of indium, zinc, copper, hafnium, zirconium, aluminum, molybdenum or tungsten, selenium and at least one of indium, zinc, copper, hafnium, zirconium, aluminum, molybdenum or tungsten, or tellurium and at least one of indium, zinc, copper, hafnium, zirconium, aluminum, molybdenum or tungsten. In some embodiments, the material of channel 108 can be doped with oxygen vacancies, fluorine, chlorine or aluminum.

In an embodiment, the source material 104 and the drain material 106 each include a material having a higher electrical conductivity than an electrical conductivity of the channel material 108. In some example, the source material 104 and drain material 106 include a metal, an alloy or a conductive oxide. Examples of the source material 104 and drain material 106 include, for example an alloy of nitrogen and titanium or tantalum or a metal, for example, tungsten, ruthenium or cobalt. In other examples, the source material 104 and drain material 106 include a conductive oxide, for example, iridium oxide, indium tin oxide, ruthenium oxide or indium zinc oxide. The source material 104 can be the same or different from the drain material 106 allowing for asymmetry when needed. In other examples, the source material 104 and drain material 106 each includes a heavily doped semiconductor material, different from a material of the channel material 108, for example, doped silicon, doped germanium, doped silicon and germanium or a suitable group III-V material.

The vertical transistor 100 further includes a drain metallization 124 on a third area of the stack 102, opposite to the drain metallization 116. The drain metallization 124 can advantageously provide uniform gate control throughout the channel material 108 in the X direction. The drain metallization 124 is in contact with a portion of the drain material 106. In an embodiment, the drain metallization 116 and 124 includes tungsten, cobalt or copper. In some embodiments, the drain metallization 116 further includes a liner layer and a fill metal. The liner layer may include ruthenium or tantalum and the fill metal may include cobalt, tungsten or copper.

A gate interconnect 128 is on a portion of the gate metallization 114. The gate interconnect 128 may extend beyond the gate metallization 114 in the Y-direction and be connected to external circuit elements.

As shown the, gate electrode 110 is also adjacent to a second sidewall 102B opposite to the sidewall 102A. The gate dielectric layer 112 is between the gate electrode 110 and the sidewall 102B. Gate electrode 110 can be one or more materials suitable for the channel material, for example including metals, alloy, or heavily doped semiconductors. The gate electrode 110 may consist of at least one P-type work function metal or N-type work function metal, depending on whether the transistor is to be a PMOS or an NMOS transistor. In some implementations, the gate electrode 110 may include a stack of two or more metal layers, where one or more metal layers are work function metal layers and at least one metal layer adjacent to the work function metal layer(s) is a sidewall protective layer.

In some embodiments, the gate electrode 110 includes hafnium, zirconium, titanium, tantalum, aluminum, tungsten, cobalt, lanthanum or an alloy of nitrogen and at least one of hafnium nitride zirconium nitride, or carbon and at least one of hafnium, zirconium, titanium, tantalum, and aluminum, or a ternary compound such as TiSiN.

Gate dielectric layer 112 may be any material suitable for the channel material. In some embodiments, the gate dielectric layer 112 includes oxygen and/or nitrogen and at least one or more of hafnium, zirconium, aluminum, lanthanum, titanium, barium, strontium, yttrium, lead scandium, zinc or silicon.

Figure 1B:
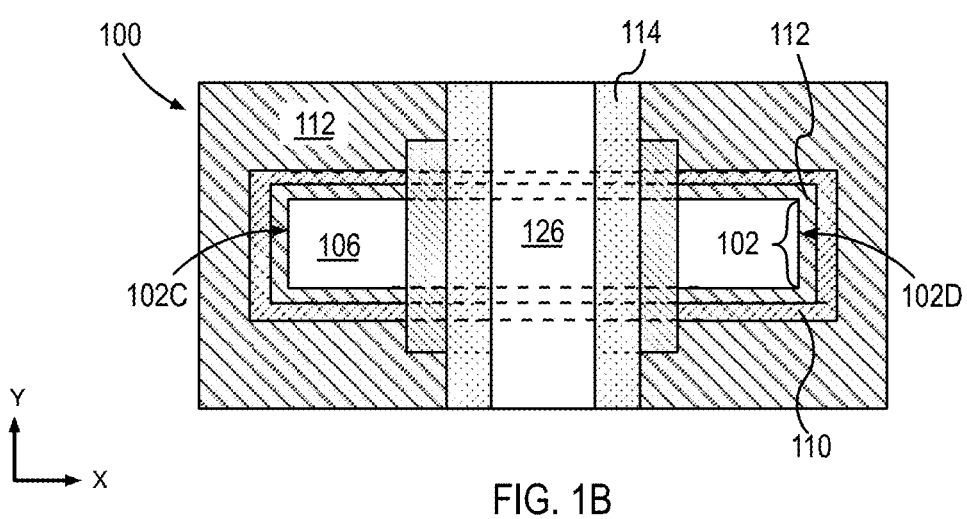
FIG. 1B illustrates a plan view of the structure in FIG. 1A.

In an embodiment, the gate electrode 110 laterally surrounds the stack 102 as shown in the plan view illustration in FIG. 1B. The drain metallization 116 and 124 are not shown in the Figure to highlight the contiguous nature of the gate dielectric layer 112 around the stack 102. In the illustrative embodiment, the gate dielectric layer 112 is also between the gate electrode 110 and opposing stack sidewalls 102C and 102D.

FIG. 1C illustrates a cross-sectional view along a longitudinal axis (line A-A') of the vertical transistor 100 depicted in FIG. 1A. The gate dielectric layer 112 has a portion 112A on the sidewall of the stack 102. The gate dielectric layer portion 112A extends along the entire thickness of the stack 102.

In the illustrative embodiment, the gate dielectric layer 112 also includes a portion 112B on the substrate 101. In an embodiment, the substrate 101 includes silicon and at least one of nitrogen, oxygen or carbon. In other embodiments, substrate 101 includes silicon, germanium or a mixture of silicon and germanium.

The relative thicknesses of each material in the stack 102 is shown in FIG. 1C. The source material 104 has a thickness, $T_{SM}$, the drain material 106 has a thickness, $T_{DM}$, and the channel material 108 has a thickness, $T_{CM}$. As shown, the gate electrode 110 is on a gate dielectric portion 112B and partially overlaps with the source material 104. The extent of overlap with the source material 104 depends on the thickness, $T_{DE}$, of the gate dielectric portion 112B. In an embodiment, $T_{DE}$, ranges between 1 nm and 20 nm. In an embodiment, $T_{SM}$ ranges between 5 nm and 200 nm. In some such embodiments, the gate electrode 110 overlaps at least 80% of the thickness, $T_{SM}$, of the source material 104. The gate electrode 110 overlaps the entire thickness, $T_{CM}$, of the channel material 108. The thickness $T_{CM}$ defines the gate length, $L_G$, of the vertical transistor 100. In an embodiment, $T_{CM}$, ranges between 1 nm and 100 nm. In most applications $T_{CM}$, is between 10 nm and 100 nm. The gate electrode 110 overlaps a partial thickness, $T_{DM}$, of the drain material 106. As shown, the gate electrode 110 has an uppermost surface 110A that extends above a lowermost surface 106A of the drain material 106. In an embodiment, the gate electrode 110 overlaps at least 1% of the thickness, $T_{SM}$, of the drain material 106. In other embodiments, the gate electrode 110 overlaps at least 1% but not more than 80% of the thickness, $T_{SM}$, of the drain material 106. The gate electrode 110 has a lateral thickness, $T_{GE}$, as shown. $T_{GE}$ may depend on the number of gate electrode layers. In some embodiments, the lateral thickness, $T_{GE}$, ranges between 2 nm and 20 nm.

In the cross-sectional illustration, the insulator 118 extends laterally on a portion of an uppermost surface 106B of the drain material 106. As shown, the gate dielectric layer 112 has a portion 112C on an uppermost surface 118A of the insulator 118. The gate metallization 114 is on a portion of the gate dielectric layer portion 112A between two portions of a second insulator layer 126. The gate metallization 114 is electrically isolated from the drain metallization 116 and drain metallization 124 by the insulator 126. The insulator 118 and 126 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide. In an embodiment, insulator 118 and 126 include a same material. In other embodiments, insulator 118 and 126 each include a different material.

The insulator 118 has lateral thickness, $T_1$. As shown, the gate metallization 114 has a lateral thickness, $T_{GM}$ that is less than the lateral thickness, $T_1$.

FIG. 1D illustrates a cross-sectional view along an axis (line B-B') perpendicular to the longitudinal axis of the vertical transistor 100 depicted in FIG. 1A. In the cross-sectional plane illustrated, the gate dielectric layer 112 surrounds the stack 102. The gate dielectric layer 112 is on sidewalls 102A and 102B of the stack 102. As shown, the gate metallization 114 bridges the gate electrode 110 that is adjacent to the gate dielectric layer 112 on sidewall 102A and the gate electrode 110 that is adjacent to the gate dielectric layer 112 on sidewall 102B.

The drain material 106 is electrically isolated from the gate metallization 114 by the gate dielectric layer 112 on sidewalls 102A and 102B. The drain material 106 is further electrically isolated from the gate metallization 114 by insulator 118 and gate dielectric layer 112 on sidewalls 102A and 102B and on uppermost insulator surface 118A.

In the illustrative embodiment, the insulator sidewall 118 is substantially coplanar with the sidewall of the stack 102. In other embodiments, sidewall 118 may be substantially vertical and stack sidewalls 102A and 102B may be tapered by an angle of less than 10 degrees with respect to a vertical axis of the stack 102.

In some embodiments, the gate dielectric layer portions 112B and 112C are not present In some such embodiments, the gate metallization 114 is in direct contact with insulator surface 118A and the gate electrode 110 is also in direct contact with the substrate 101 (not shown). When the gate electrode 110 is in direct contact with the substrate 101, the gate electrode 110 is adjacent to an entire thickness of the source material 104 (along the Z-direction).

FIG. 1E illustrates a cross-sectional view along the line C-C' in FIG. 1A. As shown, the drain metallization 116 is in contact with the drain material 106 and portions of the gate dielectric layer 112 on sidewalls 102A and 102B. In the cross-sectional illustration, the drain metallization 116 has a width, $W_{DM}$ and the stack 102 has width, $W_{MS}$. As shown, $W_{DM}$ is marginally greater than $W_{MS}$ by two times a lateral thickness (along X-direction) of the gate dielectric layer 112. In some embodiments, it is desirable to have $W_{DM}$ be less than or equal to $W_{MS}$ to prevent potential shorting between the drain metallization 116 and the gate electrode 110.

A cross section illustration through the drain metallization 124 in FIG. 1A, parallel to the line C-C' is also substantially the same as the cross-sectional illustration depicted in FIG. 1E.

Figure 2:
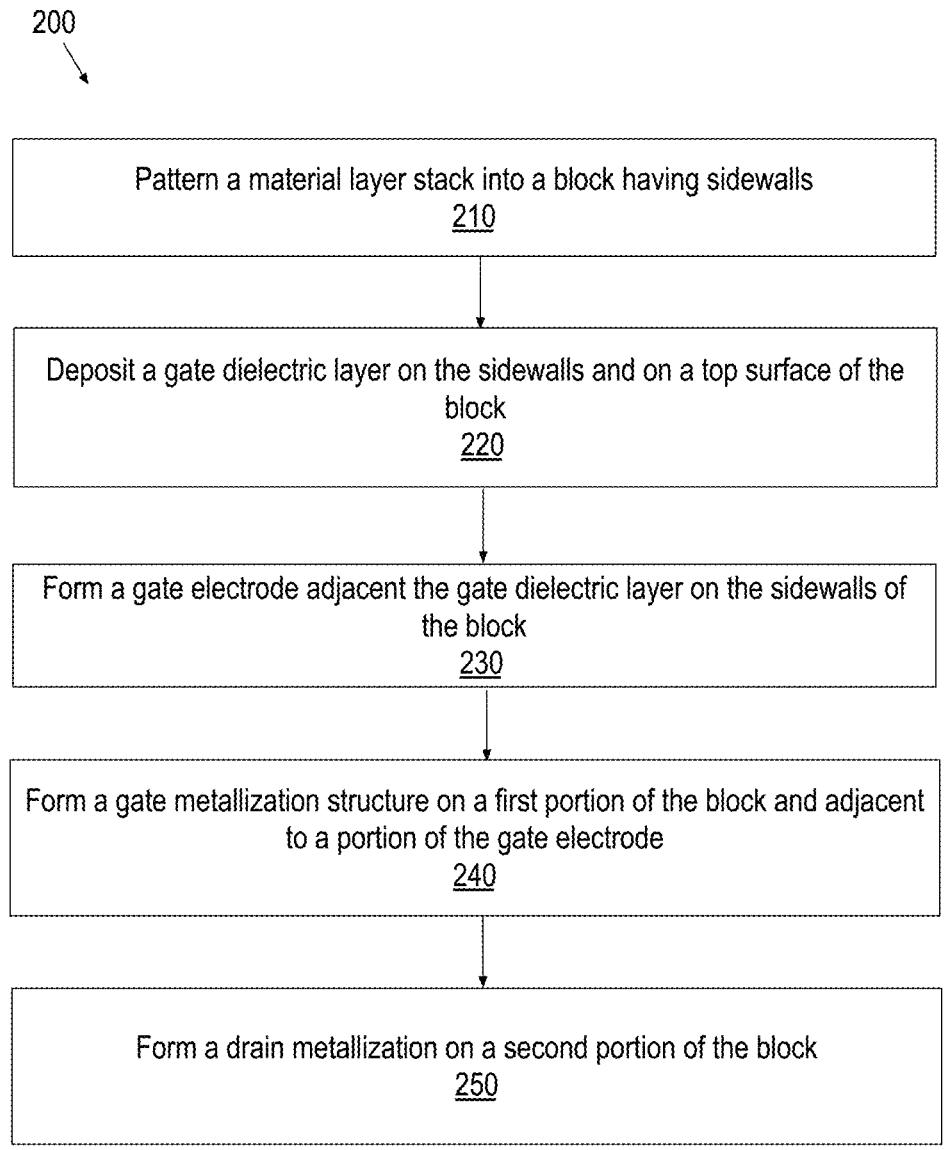
FIG. 2 illustrates a flow diagram for a method to fabricate a vertical transistor with one or more features depicted in FIGS. 1A-1E, in accordance with an embodiment of the present disclosure.

FIG. 2 illustrates a flow diagram for a method to fabricate a vertical transistor, in accordance with an embodiment of the present disclosure. The method 200 begins at operation 210 by patterning a material layer stack above a substrate into a block having sidewalls. The method 200 continues at operation 220 with the deposition of a gate dielectric layer on the sidewalls and on a top surface of the block. The method 200 continues at operation 230 with the formation of a gate electrode adjacent to the gate dielectric layer formed on sidewalls of the block. The method 200 continues at operation 240 with the formation of a gate metallization structure on a first portion of the block and adjacent to a portion of the gate electrode. The method 200 continues at operation 250 with a formation of a drain metallization on a second portion of the block.

FIGS. 3A-FIG. 13B illustrate isometric and cross-sectional views of the memory vertical transistor 100 illustrated in FIG. 1A evolving as a fabrication method, such as method 200, is practiced.

Figure 3A:
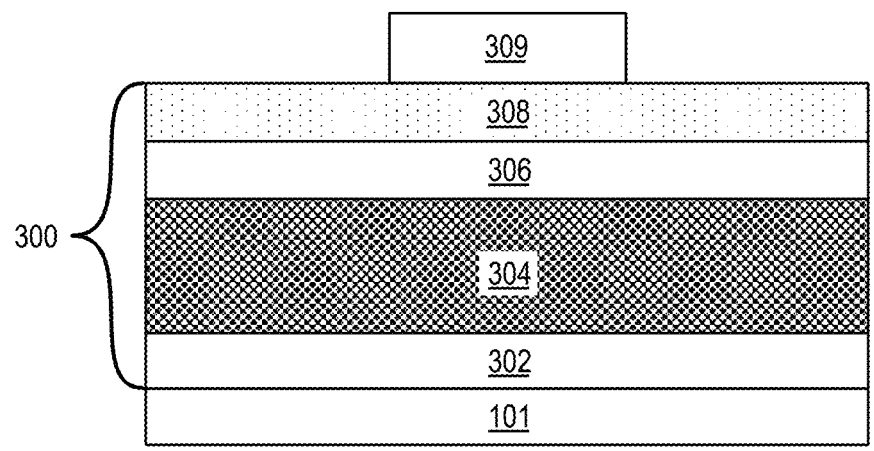
FIG. 3A illustrates a cross-sectional view following the formation of a material layer stack on a substrate and following the formation of a mask on the material layer stack, in accordance with an embodiment of the present disclosure.

FIG. 3A illustrates a cross-sectional view following the formation of a material stack 300 on substrate 101. In an embodiment, various layers of the material stack 300 are deposited in situ without breaking vacuum. For example, a layer of conductive material 302 is blanket deposited on the substrate 101, a layer of semiconductor material 304 is deposited on the conductive material 302 followed by deposition of a conductive material 306 on the layer of semiconductor material 304. In an embodiment, the conductive material 302 and 306 are the same or substantially the same as material of the source material 104 and drain material 106, respectively. In an embodiment, the layer of semiconductor material 304 includes a material that is the same or substantially the same as the channel material 108.

The relative thickness of each layer in material stack 300 may be customized. The thickness of the semiconductor material 304 may be determined by a transistor gate length desired. It is to be appreciated that a uniformity of the gate length of each vertical transistor fabricated from the material stack 300 may be controlled by ensuring a uniform material deposition process. In a given region above a substrate 101 a collection of vertical transistors may be formed with a substantially uniform gate length.

The deposition process concludes with a blanket deposition of an insulating material 308 on the conductive material 306. For example, the insulating material 308 may include silicon and at least one or more of oxygen, nitrogen or carbon. The insulating material 308 may have a thickness that is sufficiently resistive to erosion during gate electrode formation process in a downstream operation.

As shown, a mask 309 is formed on the insulating material 308. The mask 309 defines a shape and size of a block that will be formed. The mask 309 may be formed by a lithographic process.

Figure 3B:
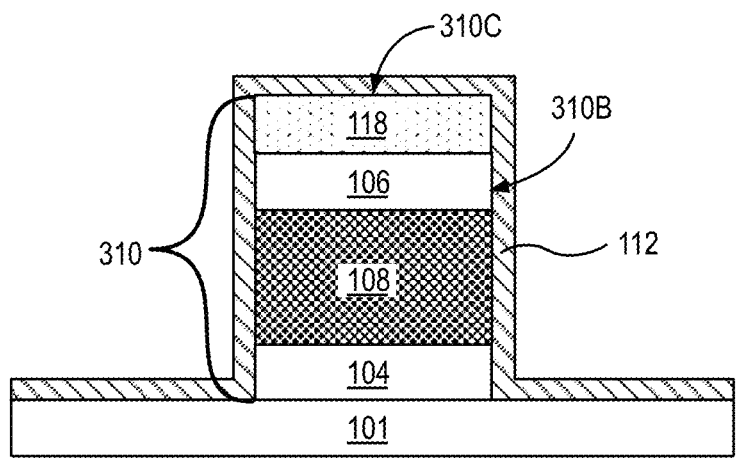
FIG. 3B illustrates a cross-sectional view of the structure in FIG. 3A following the patterning of the material layer stack to form a block and following the formation of a gate dielectric layer on the block and on the substrate.

FIG. 3B illustrates a cross-sectional view of the structure in FIG. 3A following the patterning of the material stack 300 to form a block 310 and following the formation of a gate dielectric layer 112 on the block 310 and on portions of the substrate 101.

In an embodiment, a plasma etch process is utilized to pattern material stack 300 to form the block 310. The plasma etch process forms a block 310 having a source material 104, channel material 108, drain material 106 and insulator 118.

As shown the mask 309 is removed prior to deposition of the gate dielectric layer 112 after the plasma etch process.

Depending on a thickness desired, the gate dielectric layer 112 may be deposited using an atomic layer deposition process (ALD) process or a physical vapor deposition (PVD) process. An ALD process is desirable for conformal deposition of a thin layer of gate dielectric layer 112 on sidewalls 310A and 310B of the block 310, for example layers less than or equal to 5 nm. In other embodiments, a physical vapor deposition (PVD) process is utilized. It is to be appreciated that the thickness of the gate dielectric layer 112 on an uppermost surface 310C of block relative to the thickness of gate dielectric layer 112 on the sidewalls 310A and 310B may vary by at least 10 percent when a process such as physical vapor deposition (PVD) is utilized. However, the relative thickness of the gate dielectric layer 112 on sidewalls 310A and 310B are substantially the same when deposition is performed by either an ALD or a PVD deposition process. The thickness variation between the gate dielectric layer 112 on the sidewalls 310A and 310B and the uppermost surface 310C does not affect the transistor characteristics as the transistor is controlled by relative thickness of gate dielectric layer 112 on sidewalls 310A and 310B. In some embodiments, it is desirable to have a gate dielectric layer 112 having a thicker portion on uppermost surface 310C relative to a thickness of gate dielectric layer 112 on sidewalls 310A and 310B to prevent erosion of the insulator 118. In some such embodiments, a PVD deposition process is desirable.

Figure 3C:
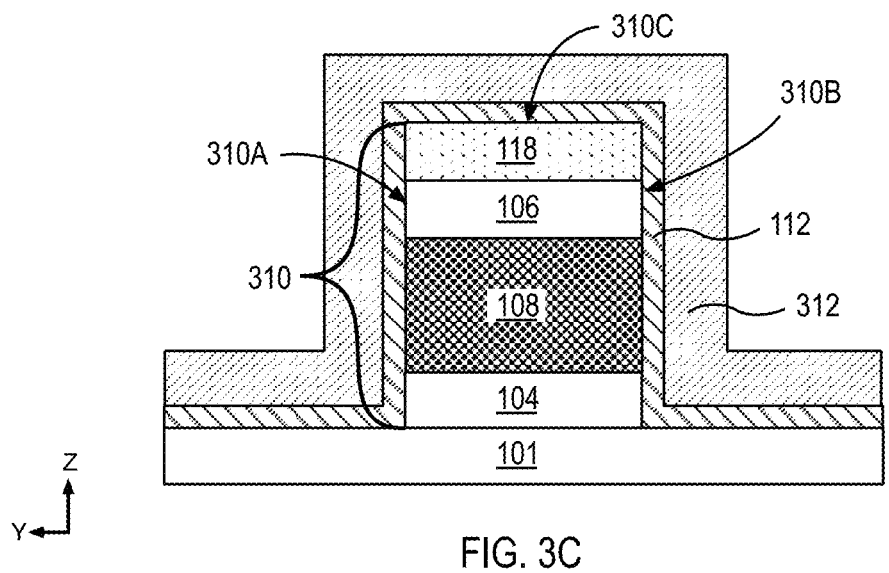
FIG. 3C illustrates the structure of FIG. 3B following the process of blanket deposition of a gate electrode layer on all exposed surfaces of the gate dielectric layer.

FIG. 3C illustrates the structure of FIG. 3B following the process of blanket deposition of a gate electrode layer 312 on all exposed surfaces of the gate dielectric layer 112. In an embodiment, gate electrode layer 312 is blanket deposited by an atomic layer deposition process (ALD) process to ensure conformal deposition above the uppermost surface 310C and adjacent to the gate dielectric layer 112 deposited on sidewalls 310A and 310B. In other embodiments, a physical vapor deposition (PVD) process is utilized.

It is to be appreciated that the thickness of the gate electrode layer 312 may vary around the block 310. For example, the thickness of gate electrode layer 312, above the uppermost surface 310C, may be greater than a thickness of gate electrode layer 312 formed on the gate dielectric layer 112 adjacent to sidewalls 310A and 310B. The difference may be at least 5% and as much as 10%. However, the relative thickness of the gate electrode layer 312 on sidewalls 310A and 310B are substantially the same when deposition is performed by either an ALD or a PVD deposition process. The gate electrode layer 312 is deposited to a thickness ranging between 2 nm and 50 nm. The desired thickness of the gate electrode layer 312 depends on the material, ease with which the material may be patterned in a subsequent operation, thickness of underlying gate dielectric layer 112 and relative spacing between two or more blocks 310.

Figure 4A:
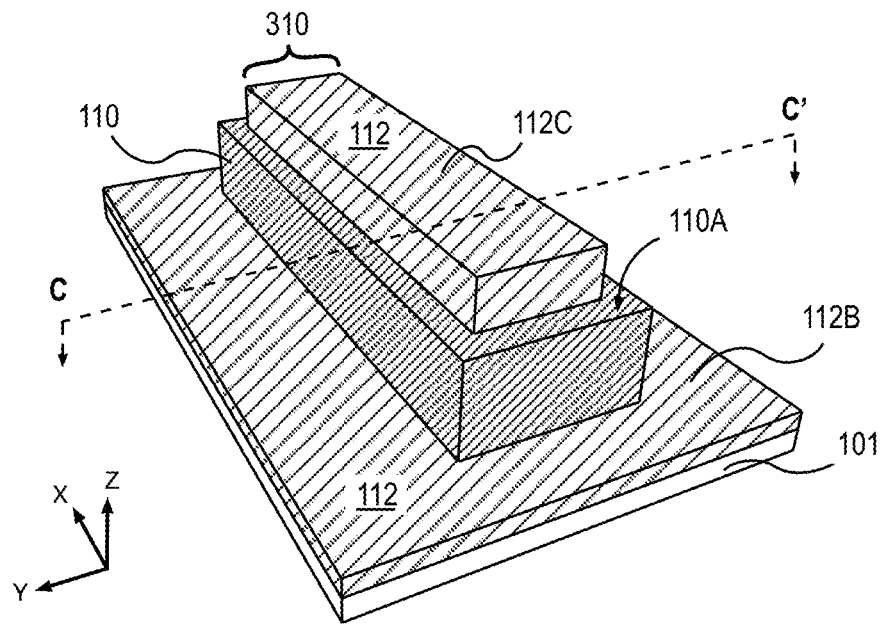
FIG. 4A illustrates an isometric view of the structure in FIG. 3A following the patterning of the gate electrode layer to form a gate electrode adjacent to the gate dielectric layer, in accordance with an embodiment of the present disclosure.

FIG. 4A illustrates an isometric view of the structure of FIG. 3A following the patterning of the gate electrode layer 312 to form a gate electrode 110 adjacent to the gate dielectric layer 112, in accordance with an embodiment of the present disclosure. In an embodiment, patterning includes a plasma etch process. For example, the plasma etch process removes the gate electrode layer 312 from gate dielectric layer portion 112C and from above the of the gate dielectric layer portion 112B formed on the substrate 101. The deposition and etch process forms a gate electrode that is contiguous around the block 310, as shown.

Figures 4B, 4C:
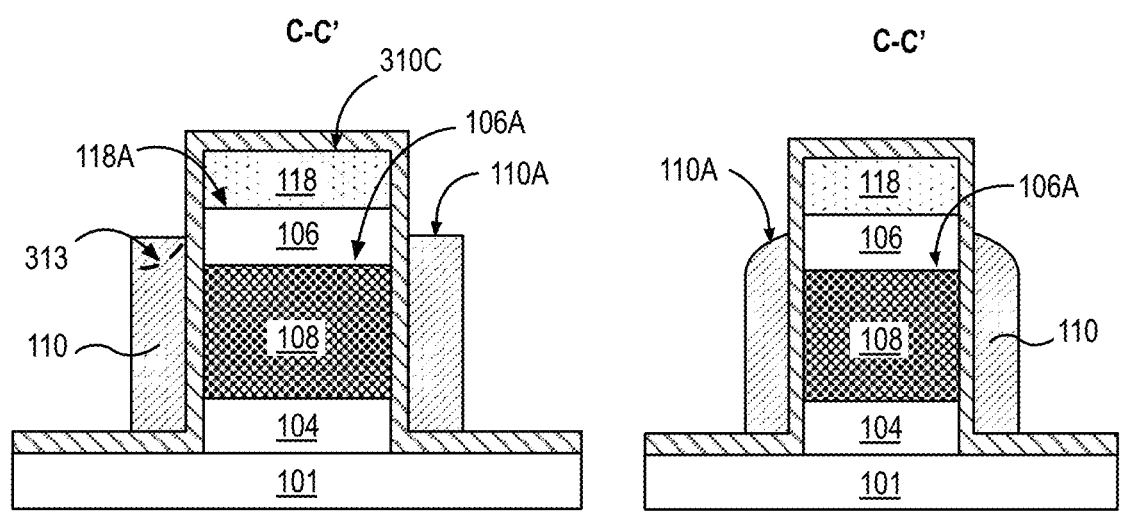
FIG. 4B illustrates a cross-sectional view, through a plane along the line C-C' in FIG. 4A, depicting a gate electrode having a substantially planar uppermost surface.
FIG. 4C illustrates a cross-sectional view depicting a gate electrode having a gradually tapered uppermost surface.

FIG. 4B illustrates a cross-sectional view through a plane along the line C-C' in FIG. 4A. The plasma etch process recesses the gate electrode 110 below the uppermost surface 310C. In the illustrative embodiment, the gate electrode 110 is recessed below the lowermost surface 118A of the insulator 118. A recess below lowermost surface 118A ensures that the gate electrode 110 does not come into contact with a drain metallization structure to be formed in a downstream operation.

As discussed above, to prevent external resistance issues the gate electrode surface 110A is not recessed below lowermost drain material surface 106A. The gate electrode surface 110A is above a level of the lowermost drain material surface 106A to provide an overlap with at least a portion of the drain material 106.

Depending on the material of the gate electrode 110 and the etch chemistry utilized, the plasma etch process may form a gate electrode 110 having a substantially planar uppermost surface 110A as shown in FIG. 4B. In other examples, the uppermost surface 110A may be concaved up as indicated by dashed line 313.

In some embodiments, the gate electrode 110 has a gradually tapered uppermost surface 110A as depicted in FIG. 4C. In some such examples, the highest point on the tapered uppermost surface 110A is least above the lowermost drain material surface 106A.

FIG. 5A illustrates the structure of FIG. 4B following the formation of a dielectric material 314 on the gate dielectric layer 112 and on the gate electrode 110. In an embodiment, dielectric material 314 includes silicon and at least one or more of oxygen, nitrogen or carbon. In an embodiment, dielectric material 314 is blanket deposited on the gate dielectric layer 112 on the gate electrode 110 using a plasma enhanced chemical vapor deposition (PECVD) or a chemical vapor deposition (CVD) process.

FIG. 5B illustrates the structure of FIG. 5A following the process of planarization of the dielectric material 314. After deposition, the dielectric material 314 may be planarized. A planarization process is carried out, for example, to remove an excess dielectric material 314 from above the block 310. The planarization process may include a chemical mechanical polish (CMP) process that forms a planar top surface 314A for subsequent process operations. In some examples, the CMP process may be halted before the gate dielectric layer portion 112C is exposed. The CMP process leaves some dielectric material 314 on the gate dielectric layer portion 112C as indicated by the dashed line 314B. The dielectric material 314 is subsequently removed selectively with respect to the gate dielectric layer portion 112C using a wet chemical etching process. In some examples, the dielectric material 314 may be recessed just below an uppermost surface 118B of the insulator material 118.

Figure 6A:
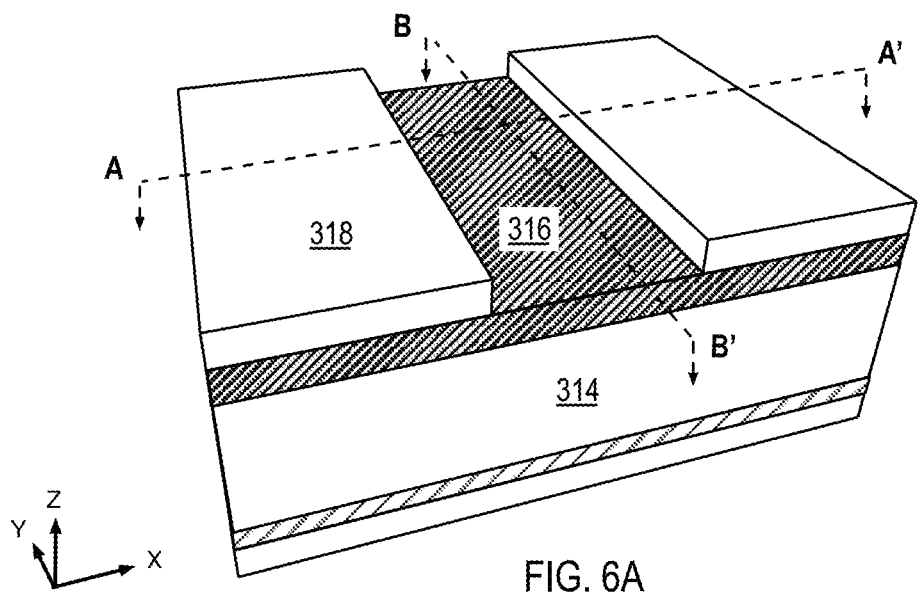
FIG. 6A illustrates an isometric view of the structure in FIG. 5B following the formation of a dielectric hardmask on the first dielectric material and following the formation of a mask on the dielectric hardmask.

FIG. 6A illustrates an isometric view of the structure in FIG. 5B following the formation of a dielectric hardmask 316 on the dielectric material 314 and following the formation of a mask 318 on the dielectric hardmask 316. In an embodiment, the dielectric hardmask 316 includes silicon and at least one or more of carbon, oxygen and nitrogen. In other embodiments, the dielectric hardmask 316 includes a material that is substantially similar to the dielectric material 314. For example, dielectric material 314 and dielectric hardmask 316 may both include silicon, carbon and oxygen, where a percentage of carbon in the dielectric hardmask 316 may be greater than a percentage of carbon in the dielectric material 314. In some examples, the percentage of carbon may prevent dielectric hardmask 316 from being removed by a wet chemical etch process.

Figure 6B:
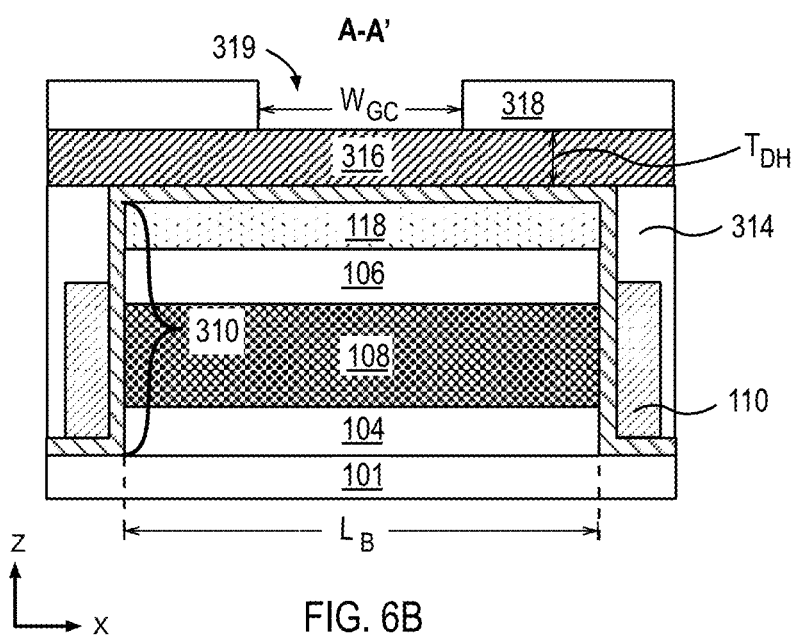
FIG. 6B illustrates a cross-sectional view along a longitudinal axis (line A-A') in FIG. 6A.

FIG. 6B illustrates a cross-sectional view along a longitudinal axis (line A-A') in FIG. 6A. In the illustrative embodiment, the dielectric hardmask 316 has a thickness, $T_{DH}$. As shown, the mask 318 has an opening 319. The opening 319 has a width, $W_{GC}$, that determines a width of a gate contact to be formed. The $W_{GC}$ depends on a length, $L_B$, of the block 310 along the X axis, and on a size of contacts to be formed above the drain material 106. The opening 319 is designed to expose portions of the gate electrode 110 along $L_B$.

Figure 6C:
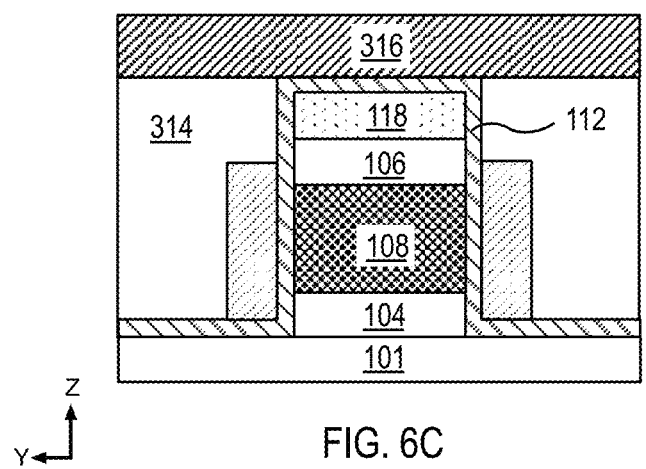
FIG. 6C illustrates a cross-sectional view along an axis (line B-B') orthogonal to the longitudinal axis in FIG. 6A.

FIG. 6C illustrates a cross-sectional view of the structure in FIG. 6A along an axis (defined by line B-B'). As shown in FIG. 6C, the dielectric hardmask 316 is on the gate dielectric layer 112 and the dielectric material 314.

Figure 7A:
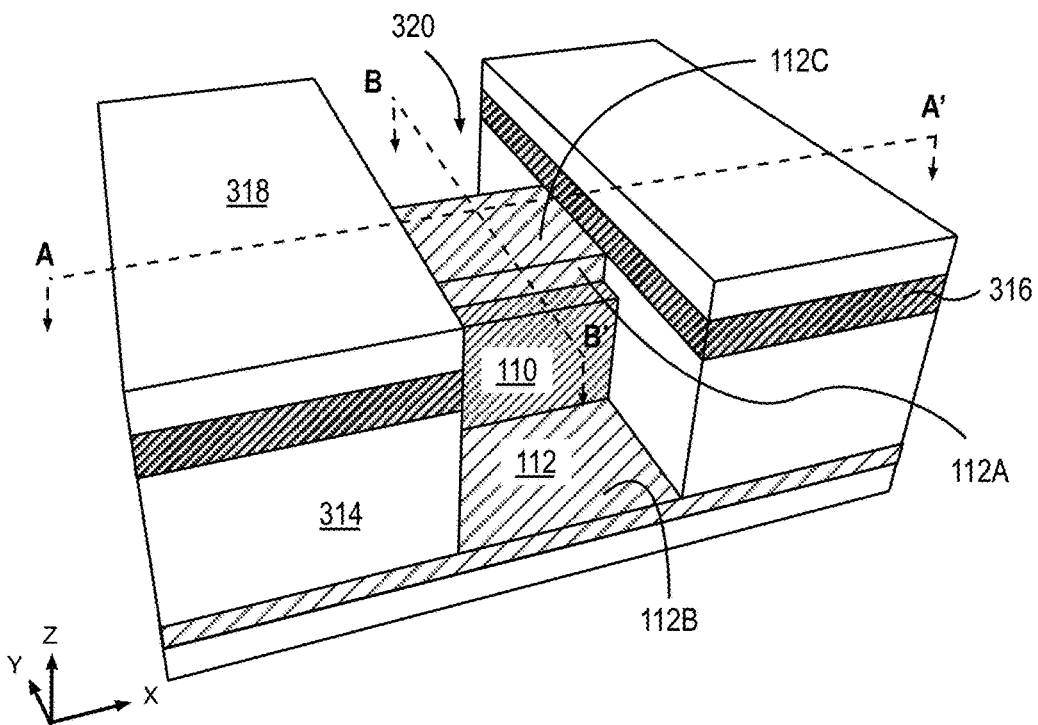
FIG. 7A illustrates an isometric view of the structure in FIG. 6A following the process of etching the first dielectric hardmask and portions of the first dielectric material to expose portions of the gate electrode and the gate dielectric layer.

FIG. 7A illustrates an isometric view of the structure in FIG. 6A following the process of etching the dielectric hardmask 318 and portions of the dielectric material 314 to expose portions of the gate electrode 110 and portions of gate dielectric layer 112. In an embodiment, the etch includes a plasma etch process. In an embodiment, the plasma etch process forms an opening 320 by etching the dielectric hardmask 318 and exposes a gate dielectric layer portion 112C. The plasma etch is continued until a portion of sidewall gate dielectric layer portion 112A and portions of the gate electrode 110 uncovered by the dielectric material 314 are also exposed. In the illustrative embodiment, gate dielectric layer portion 112B is also exposed.

Figure 7B:
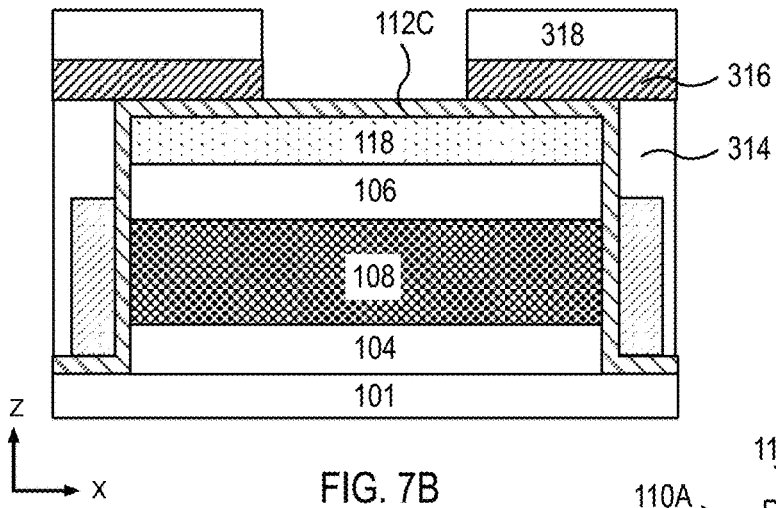
FIG. 7B illustrates a cross-sectional view along a longitudinal axis (line A-A') in FIG. 7A.

FIG. 7B illustrates a cross-sectional view along a longitudinal axis (line A-A') in FIG. 7A. As shown, the dielectric layer portion 112C is exposed immediately after etching the dielectric hardmask 314.

Figure 7C:
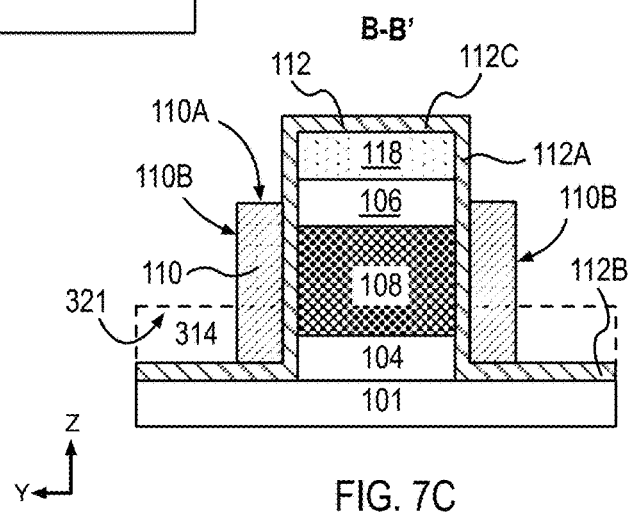
FIG. 7C illustrates a cross-sectional view along an axis (line B-B') orthogonal to the longitudinal axis in FIG. 7A.

FIG. 7C illustrates a cross-sectional view along an axis (line B-B') orthogonal to the longitudinal axis in FIG. 7A. As shown the dielectric material 314 is also removed from sidewalls of the gate electrode 110. Complete removal of the dielectric material 314 from an uppermost gate electrode surface 110A and from sidewalls 110B of the gate electrode 110 may help to increase contact between an interconnect structure to be formed and the gate electrode 110. It is to be appreciated that the etch process is selective to the gate dielectric layer portion 112C. A selective etch process that leaves the gate dielectric layer portion 112C intact helps to prevent erosion of the insulator 118.

As shown, in some embodiments, removing the dielectric material 314 entirely from gate electrode sidewalls 110B also exposes the gate dielectric layer portion 112B. In other embodiments, portions of the dielectric material 314 remain adjacent to gate electrode sidewalls 110B and on gate dielectric layer portion 112B as indicated by dashed line 321. In some further embodiments, a thin layer of dielectric material 314 may remain adjacent to a portion of the gate electrode sidewalls 110B after the etch process.

In an embodiment, where the mask 318 includes a material that is lithographically patterned, the mask 318 is removed prior to deposition of gate metallization material in a subsequent operation.

Figure 8A:
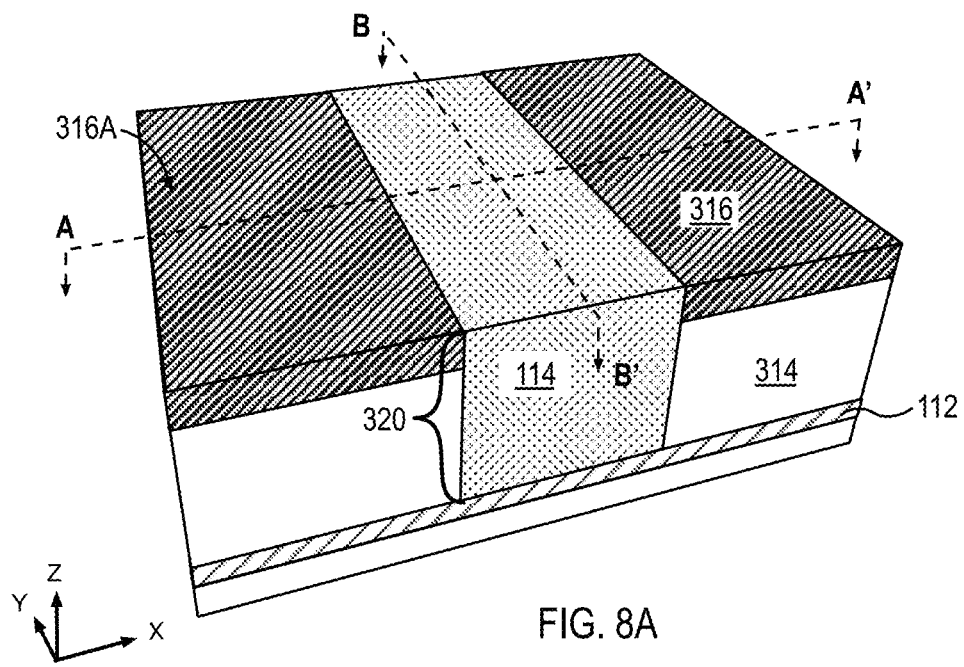
FIG. 8A illustrates an isometric view of the structure in FIG. 7A following the process of deposition of a gate contact material on portions of the gate electrode and the gate dielectric layer.

FIG. 8A illustrates an isometric view of the structure in FIG. 7A following the formation of a gate metallization 114 on portions of the gate electrode 110 and on portions of the gate dielectric layer 112 after removal of the mask 318. In an embodiment, the gate metallization material is blanket deposited into the opening 319 and on the uppermost surface 316A of the dielectric hardmask 316. The gate metallization material includes a material that is the same or substantially the same as the material of the gate metallization 114. In some embodiments, a liner layer is blanket deposited in the opening 320, where the liner layer includes ruthenium or tantalum, for example, followed by a fill metal such as tungsten, cobalt, or nickel, on the liner layer.

In an embodiment, planarization of the gate metallization material is performed after the deposition process, to remove the gate metallization material from the uppermost surface 316A. The planarization process may include a chemical mechanical polish (CMP) process. In an embodiment, the CMP process forms a gate metallization 114 in the opening 320. As shown, the gate metallization 114 is also adjacent to dielectric material 314 and dielectric hardmask 316.

Figure 8B:
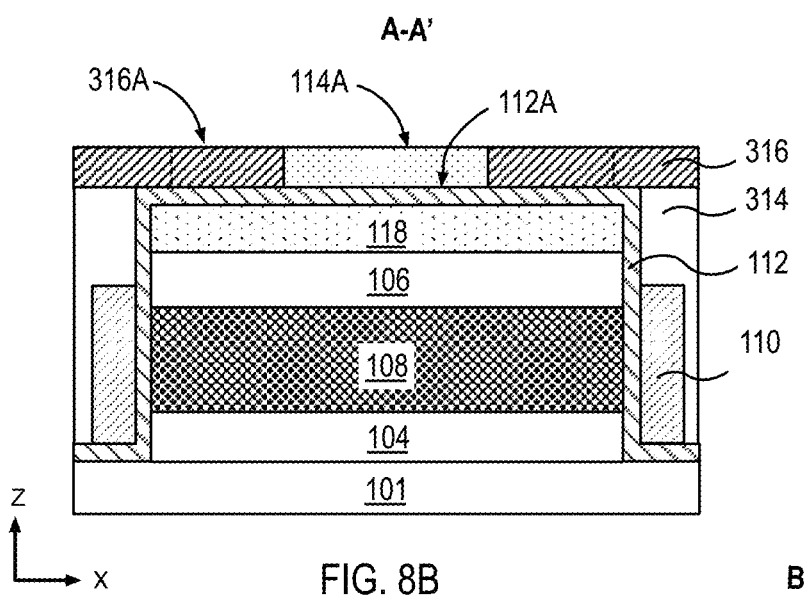
FIG. 8B illustrates a cross-sectional view along a longitudinal axis (line A-A') in FIG. 8A.

FIG. 8B illustrates a cross-sectional view along a longitudinal axis (line A-A') in FIG. 8A. As shown, the gate metallization 114 has an uppermost surface 114A that is substantially coplanar with the uppermost dielectric hardmask surface 316A.

Figure 8C:
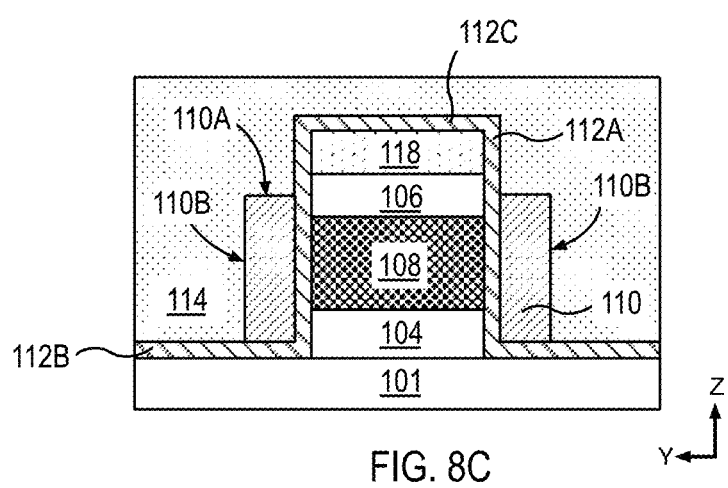
FIG. 8C illustrates a cross-sectional view along an axis (line B-B') orthogonal to the longitudinal axis in FIG. 8A.

FIG. 8C illustrates a cross-sectional view along an axis (line B-B') orthogonal to the longitudinal axis in FIG. 8A. As shown, the gate metallization 114 is formed on gate dielectric layer portions 112A, 112C, on gate electrode sidewall 110B and on gate electrode uppermost surface 110A. In the illustrative embodiment, the gate metallization 114 is also in contact with the gate dielectric layer portion 112B.

Figure 9A:
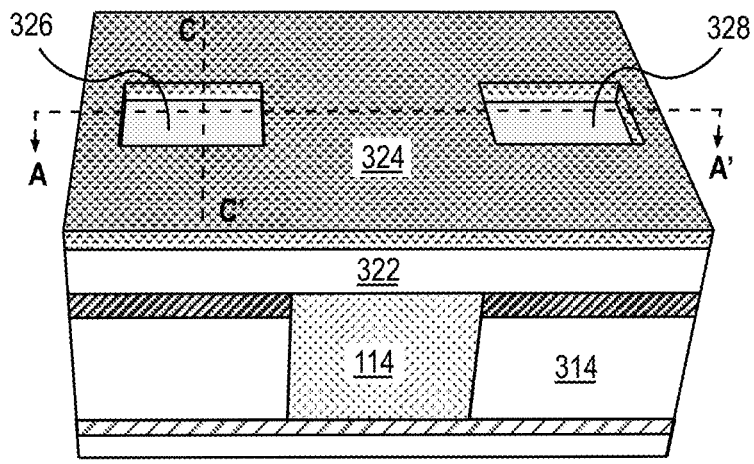
FIG. 9A illustrates an isometric view of the structure in FIG. 8A following the process of deposition of a second dielectric material and the formation of a mask to define a pair of openings for drain contacts.

FIG. 9A illustrates an isometric view of the structure in FIG. 8A following the deposition of a dielectric material 322 and the formation of a mask 324 to define drain metallization opening 326 and drain metallization opening 328. In an embodiment, the dielectric material 322 includes a material that is the same or substantially the same as dielectric material 314. In an embodiment, the dielectric material 322 is blanket deposited using a PECVD or a CVD process on the dielectric hardmask 316 and on the gate metallization 114. In some embodiments, the mask 324 is formed by a lithographic process. The mask 324 defines a shape and size of drain metallization structures to be formed.

Figure 9B:
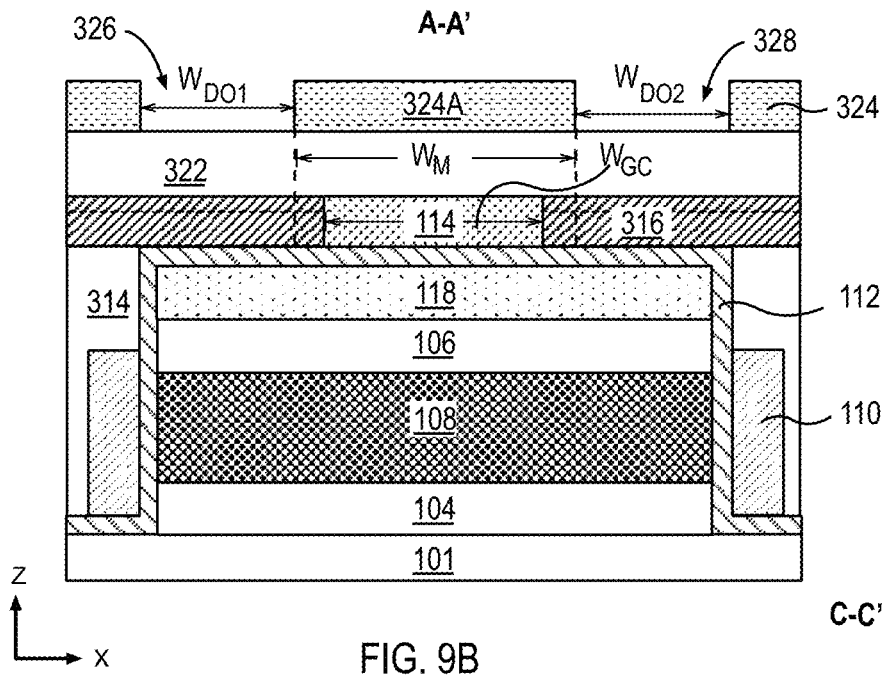
FIG. 9B illustrates a cross-sectional view along a longitudinal axis (line A-A') in FIG. 9A.

FIG. 9B illustrates a cross-sectional view along a longitudinal axis (line A-A') in FIG. 9A. In the cross-sectional illustration, mask 324 has a mask portion 324A between opening 326 and 328. The mask portion 324 has a width, $W_M$ that is greater than the width $W_{GC}$, of the gate metallization 114. $W_M$ is greater than $W_{GC}$ to ensure that the drain metallization structures are not formed in contact with sidewalls of the gate metallization 114.

In the illustrative embodiment, the drain metallization opening 326 and drain metallization opening 328 each have a width, $W_{DO1}$ and $W_{DO2}$, respectively. In some embodiments, $W_{DO1}$ is substantially equal to $W_{DO2}$, while in other embodiments, $W_{DO1}$ is greater than or less that $W_{DO2}$. It is to be appreciated that the drain metallization openings 326 and 328 may extend over the gate dielectric layer 112 but not over the gate electrode 110.

Figure 9C:
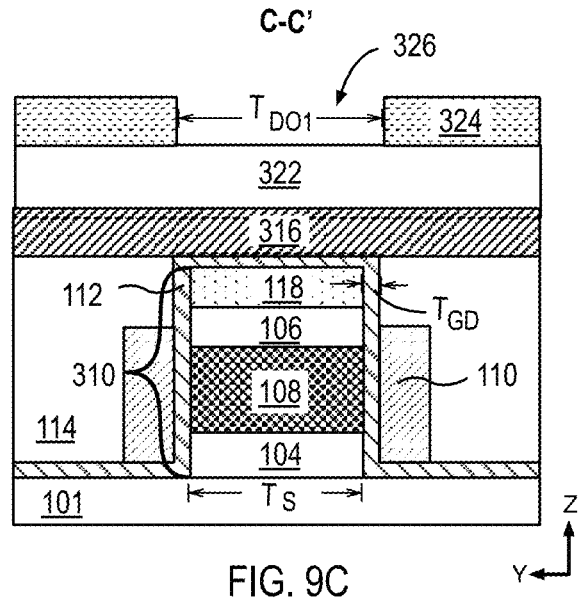
FIG. 9C illustrates a cross-sectional view along a line C-C' orthogonal to the longitudinal axis in FIG. 9A.

FIG. 9C illustrates a cross-sectional view along a line C-C' orthogonal to the longitudinal axis in FIG. 9A. The cross-sectional illustration shows a cut through the drain metallization opening 326. As shown, drain metallization opening 326 has a lateral thickness $T_{DO1}$, that is less than a combined lateral thickness, $T_S$, of the block 310 and two times the thickness, $T_{GD}$, of the gate dielectric layer 112, i.e, $T_{DO1} < T_{GD} + 2\ T_S$, to ensure that a drain metallization (to be formed) does not laterally extend over the gate electrode 110.

Figure 10A:
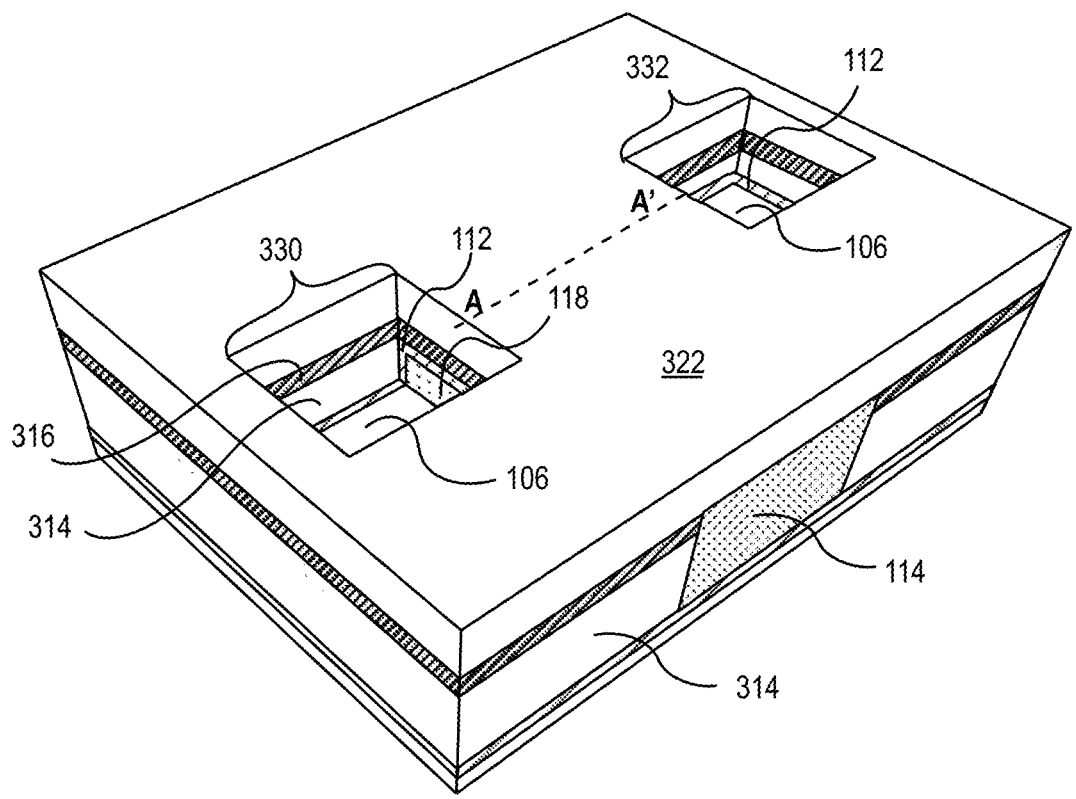
FIG. 10A illustrates an isometric view of the structure in FIG. 9A following the process of etching the second dielectric material and portions of the block through the mask to form a pair of openings for drain contacts.

FIG. 10A illustrates an isometric view of the structure in FIG. 9A following the process of etching the dielectric material 322, dielectric hardmask 316, portions of gate dielectric layer 112 and portions of the insulator 118 to form openings 330 and 332. In an embodiment, a plasma etch process is utilized to etch the various layers and form openings 330 and 332. The plasma etch first removes a portion of the dielectric material 322. The etch is then utilized to remove portions of the dielectric hardmask 316, gate dielectric layer 112 and portions of the insulator 118 to expose the drain material 106.

Figure 10B:
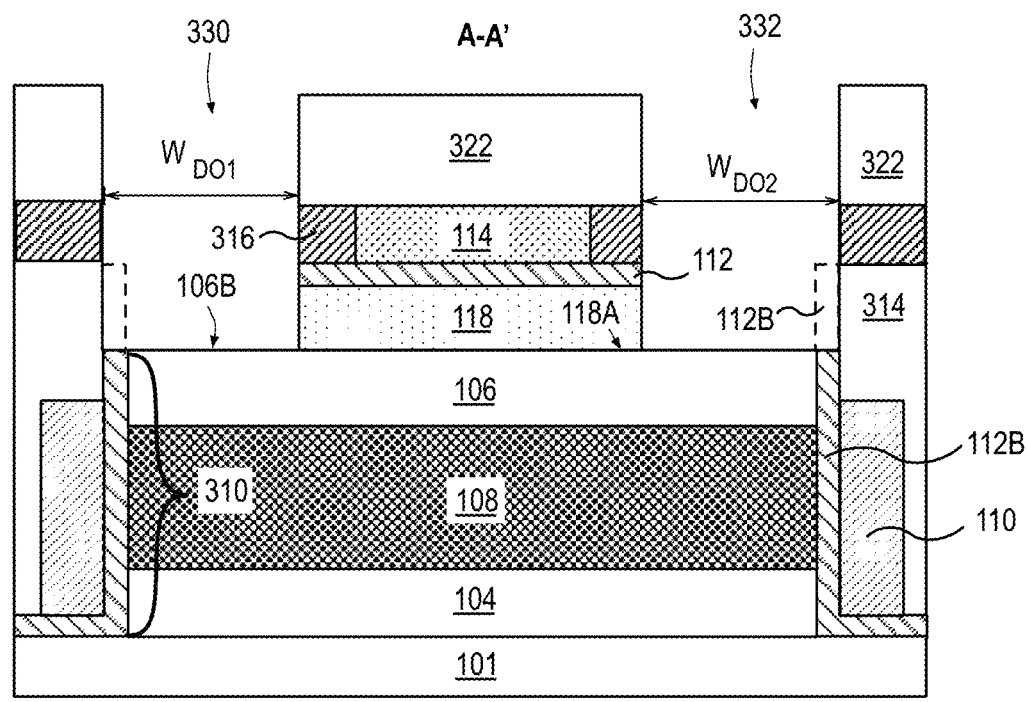

FIG. 10B illustrates a cross-sectional view along a longitudinal axis (line A-A') in FIG. 10A. Depending on the etch chemistry and the material of the gate dielectric layer 112, gate dielectric layer portions 112B (adjacent to the sidewall of block 310) may also be etched simultaneously with the insulator 118. In some examples, the sidewall gate dielectric layer portions 112B above the conductive layer surface 106B and directly adjacent to dielectric material 314, is removed after etching the insulator 118. In other examples, it may be advantageous for the gate dielectric layer portion 112B above the conductive layer surface 106B to remain (dashed line) after etching the insulator 118. A remaining gate dielectric layer portion 112B in the openings 330 and 332 may protect the gate electrode 110 from being exposed during processing.

In some embodiments, the opening 330 and 332 may each have a width that varies at the top and at the bottom of the opening depending on the etch profile. It is to be appreciated that the size and profile of the openings 330 and 332 is such that the gate electrode 110 is not exposed.

In some examples, a small portion of the conductive layer surface 106B may be recessed relative to the surface 118A. The recess of the conductive layer surface 106B may extend 1 nm-2 nm below the surface 118A.

Figure 11A:
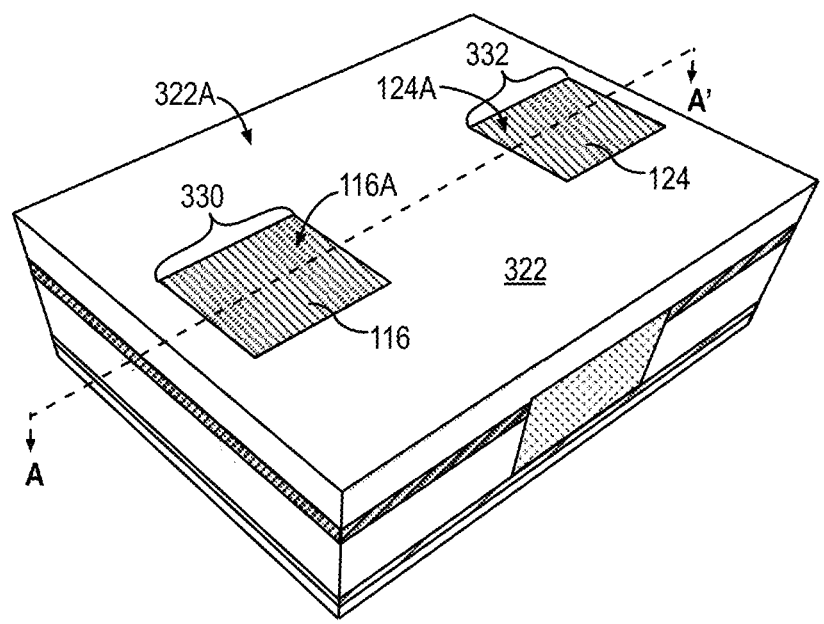
FIG. 11A illustrates an isometric view of the structure in FIG. 10A following the process of deposition of a drain contact material in the pair of openings and planarization of the drain contact material.

FIG. 11A illustrates an isometric view of the structure in FIG. 10A following the formation of drain metallization 116 and 124 in the openings 330 and 332, respectively. In an embodiment, a drain metallization material is blanket deposited into the openings 330 and 332, and on the uppermost surface 322A of the dielectric material 322. The drain metallization material includes a material that is the same or substantially the same as the material of the drain metallization 116 or 124. In some embodiments, a liner layer is blanket deposited in the openings 330 and 332, where the liner layer includes ruthenium or tantalum, for example, followed by deposition of a fill metal such as tungsten, cobalt, or nickel, on the liner layer.

In an embodiment, planarization of the drain metallization material is performed after the deposition process, to remove the drain metallization material from the uppermost surface 322A. The planarization process may include a chemical mechanical polish (CMP) process. In an embodiment, the CMP process forms a drain metallization 116 in the opening 330 and a second drain metallization 124 in the opening 332.

In the illustrative embodiment, drain metallization 116 and drain metallization 124 have uppermost surfaces 116A and 124A, respectively that are coplanar or substantially coplanar with the uppermost surface 322A of the dielectric material 322, after the planarization process.

Figure 11B:
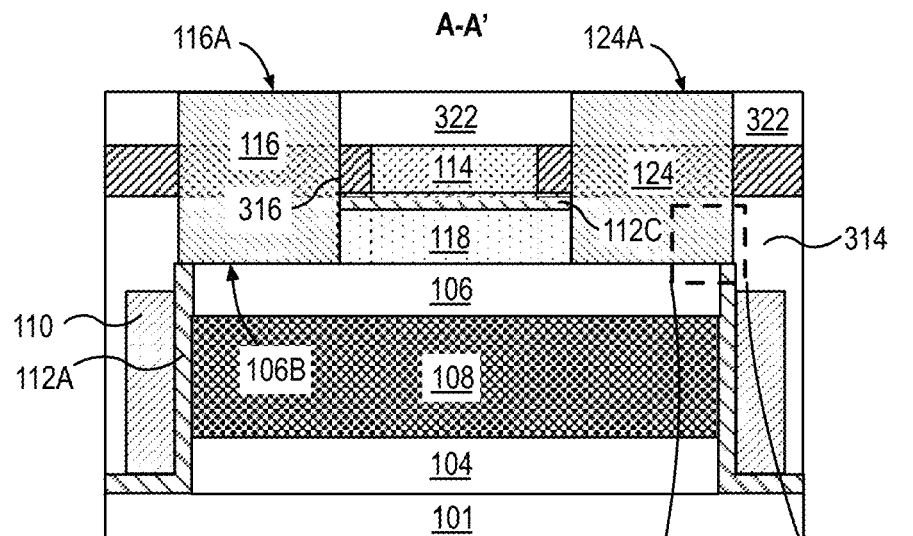
FIG. 11B illustrates a cross-sectional view along a longitudinal axis (line A-A') in FIG. 11A.

FIG. 11B illustrates a cross-sectional view along a longitudinal axis (line A-A') in FIG. 11A. As shown, the drain metallization 116 and drain metallization 124 are adjacent to dielectric material 314 and dielectric hardmask 316. The drain metallization 116 and drain metallization 124 are also adjacent to the insulator 118 and the gate dielectric layer portion 112C on the insulator 118. As shown, the drain metallization openings 330 and 332 do not extend beyond gate dielectric layer portions 112B. In the illustrative embodiment, the drain metallization 116 and drain metallization 124 are substantially aligned with respect to the gate dielectric layer portions 112B. In some examples, the drain metallization 116 and drain metallization 124 may extend beyond the dielectric layer portions 112B over the gate electrode 110. However, to prevent any shorting between the drain metallization 116 and drain metallization 124 and the gate electrode 110, the gate electrode 110 is recessed below an uppermost drain material surface 106B.

In other embodiments, the gate dielectric layer portion 112B may not be recessed to a level of the uppermost drain material surface 106B.

Figure 11C:
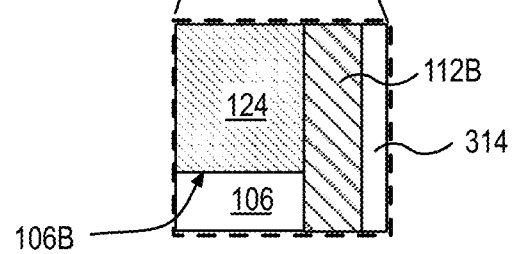
FIG. 11C is an enhanced cross-sectional representation of a portion of the structure in FIG. 11B, where a gate dielectric layer portion, is above the level of the uppermost drain material surface.

FIG. 11C is an enhanced cross-sectional representation of a portion of the structure in FIG. 11B, where the gate dielectric layer portion 112B, above the level of the uppermost drain material surface 106B, is not removed. In the illustrative embodiment, the drain metallization 124 is adjacent to the gate dielectric layer portion 112B.

Figure 12A:
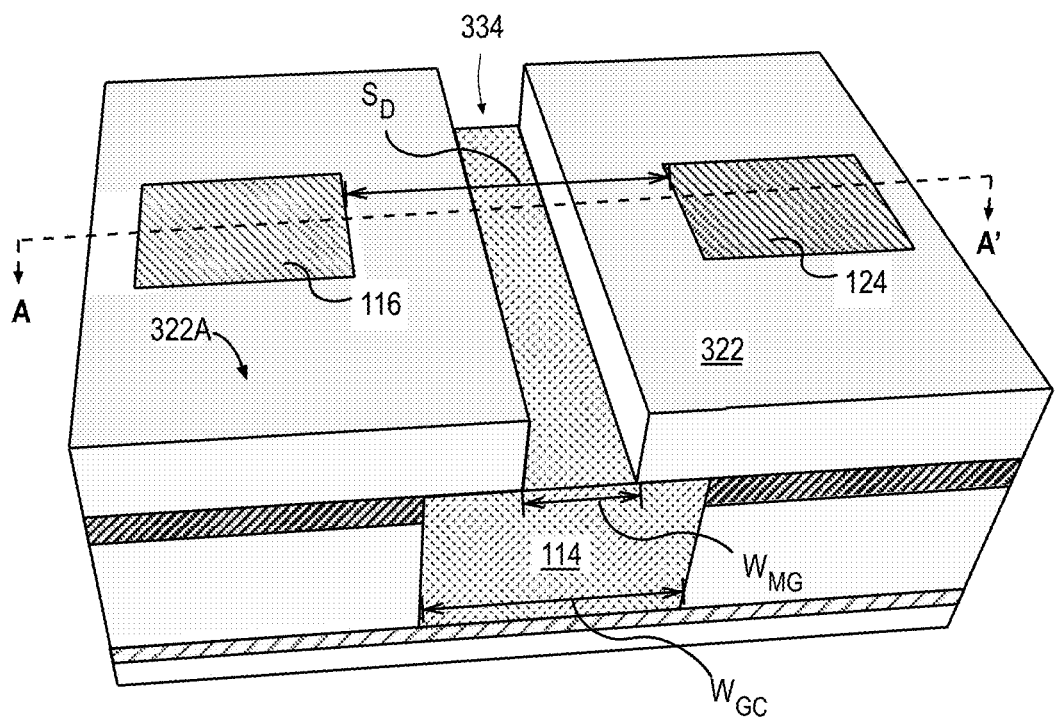
FIG. 12A illustrates an isometric view of the structure in FIG. 12A following the process of etching an opening in the second dielectric material above a portion of the gate contact to form an opening for a gate interconnect.

FIG. 12A illustrates an isometric view of the structure in FIG. 12A following the process of etching the dielectric material 322 above a portion of the gate metallization 114 to form an opening 334 for a gate interconnect. In an embodiment, a mask is patterned above the surface 322A and on the drain metallization 116 and drain metallization 124. The mask defines an opening 334 in a region between the drain metallization 116 and drain metallization 124. The isometric illustration in FIG. 12A is representative of a structure after removal of the mask utilized to form the opening 334.

The opening 334 has a width, $W_{MG}$ as shown. The width is determined by the spacing, $S_D$, between the drain metallization 116 and drain metallization 124. It is advantageous to design an opening 334 having a width $W_{MG}$, that is less than $S_D$ to prevent shorting between gate interconnect and drain metallization 116 and/or drain metallization 124. In some embodiments, $W_{MG}$ is substantially equal to $W_{GC}$.

To provide a greater process margin, in some embodiments, the opening 334 has a width, $W_{MG}$, that is less than a width, $W_{GC}$, of the gate metallization 114, such as is illustrated.

Figure 12B:
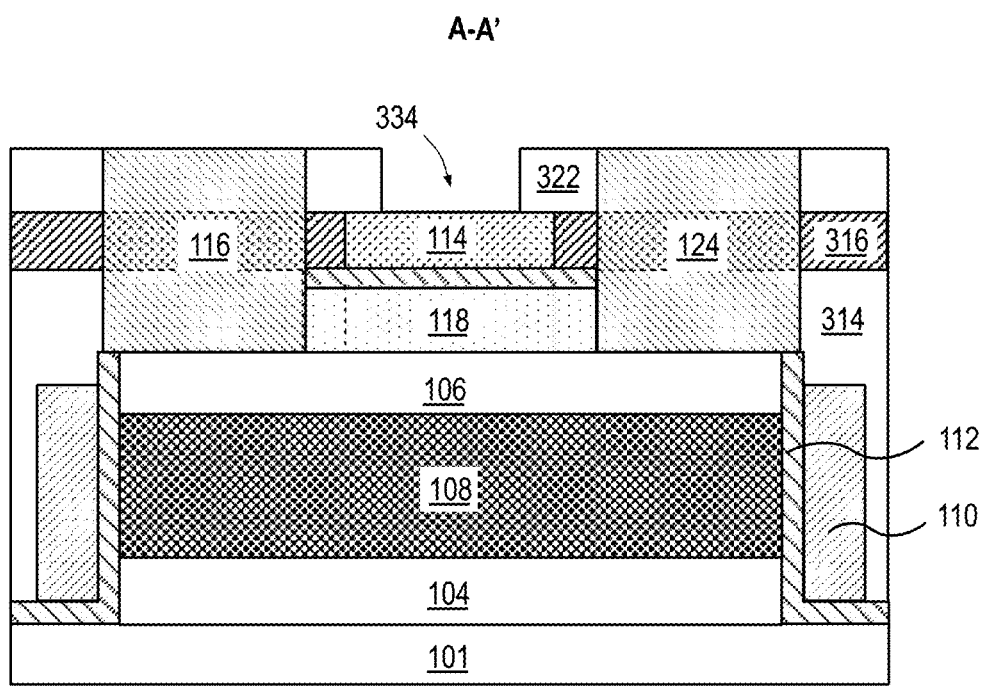
FIG. 12B illustrates a cross-sectional view along a longitudinal axis (line A-A') in FIG. 12A.

FIG. 12B illustrates a cross-sectional view along a longitudinal axis (line A-A') in FIG. 12A. As shown, a portion of the dielectric material 322 remains above the gate metallization 114 after the etch process.

Figure 13A:
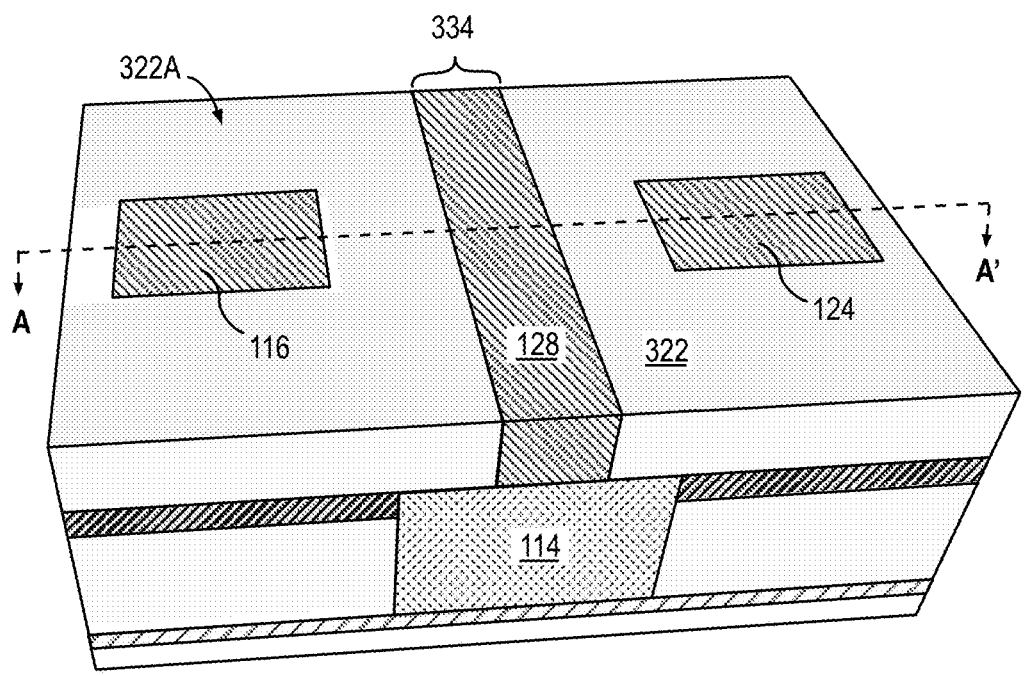
FIG. 13A illustrates an isometric view of the structure in FIG. 12A following the process of deposition of a conductive material in the opening for the gate interconnect and planarization of the conductive material.

FIG. 13A illustrates an isometric view of the structure in FIG. 12A following the formation of a gate interconnect 128 in the opening 334. In an embodiment, a gate interconnect material is blanket deposited into the opening 334 and on the uppermost surface 322A of the dielectric material 322 and from uppermost surfaces 116A and 124A of the drain metallization 116 and drain metallization 124, respectively. The gate interconnect material includes a material that is the same or substantially the same as the material of the gate interconnect 128. In some embodiments, a liner layer is blanket deposited in the opening 334, where the liner layer includes ruthenium or tantalum, for example, followed by deposition of a fill metal such as tungsten, cobalt, or nickel, on the liner layer.

In an embodiment, planarization of the gate interconnect material is performed after the deposition process, to remove the gate interconnect material from the uppermost surface 322A. The planarization process may include a chemical mechanical polish (CMP) process. In an embodiment, the CMP process forms a gate interconnect 128 in the opening 334.

Figure 13B:
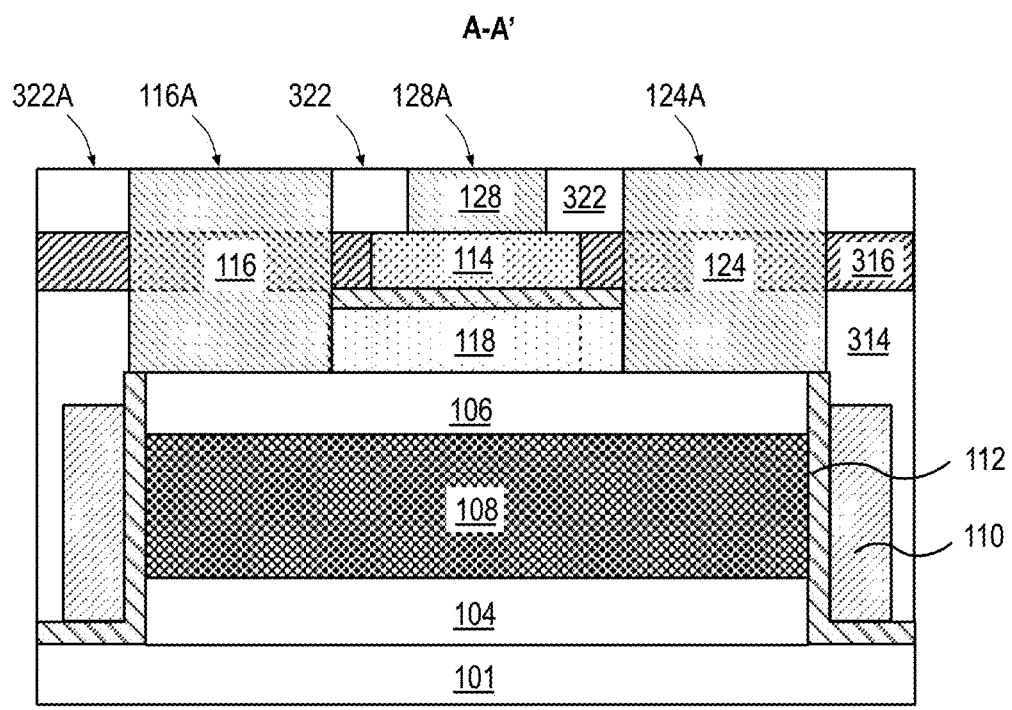
FIG. 13B illustrates a cross-sectional view along a longitudinal axis (line A-A') in FIG. 13A.

FIG. 13B illustrates a cross-sectional view along a longitudinal axis (line A-A') in FIG. 13A. In the illustrative embodiment, gate interconnect 128 has an uppermost surface 126A that is coplanar or substantially coplanar with uppermost surface 322A of the dielectric material 322 and uppermost surfaces 116A and 124A of the drain metallization 116 and drain metallization 124, respectively after the planarization process.

Figure 14:
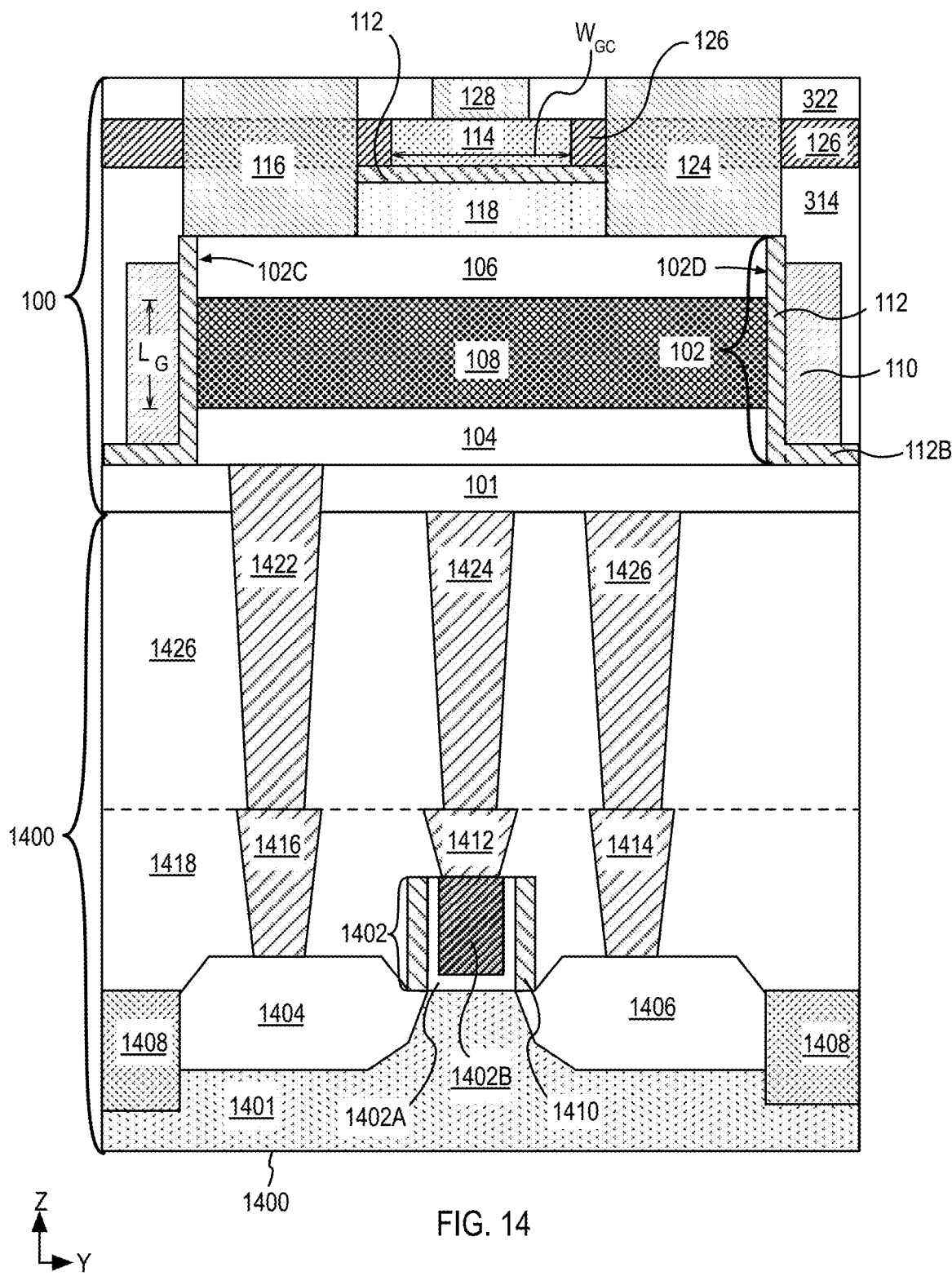
FIG. 14 illustrates a cross-sectional view of a silicon transistor on a first plane integrated with a vertical transistor on a second plane above the first plane.

FIG. 14 illustrates an integrated circuit structure including a MOS transistor 1400 including a single crystal semiconductor on a first plane coupled to a vertical transistor 100 on a second plane. In the illustrative embodiment, the vertical transistor 100 is above the MOS transistor 1400. In an embodiment, the transistor 1400 is on a substrate 1401 and has a gate 1402, a source region 1404, and a drain region 1406. In the illustrative embodiment, an isolation 1408 is adjacent to the source region 1404, drain region 1406 and portions of the substrate 1401. In some implementations of the disclosure, such as is shown, a pair of sidewall spacers 1410 are on opposing sides of the gate 1402.

The transistor 1400 further includes a gate contact 1412 above and electrically coupled to the gate 1402, and a drain contact 1414 above and electrically coupled to the drain region 1406, and a source contact 1416 above and electrically coupled to the source region 1404, as is illustrated in FIG. 14. The transistor 1400 also includes dielectric 1418 adjacent to the gate 1402, source region 1404, drain region 1406, isolation 1408, sidewall spacers 1410, gate contact 1412, drain contact 1414 and source contact 1416.

In an embodiment, the transistor 100 is a vertical transistor with one or more structural and material properties described above in FIG. 1A. The vertical transistor 100 includes a material stack 102 having, a source material 104, a drain material 106, and a channel material 108 therebetween. The vertical transistor 100 further includes a gate electrode 110 adjacent to a sidewall of the stack 102, where the sidewall includes the channel material 108, and at least a partial thickness of the source material 104 and a partial thickness of the drain material 106. By overlapping the gate electrode 110 with a partial thickness of both the source material 104 and the drain material 106, the vertical transistor 100 can operate with significantly reduced external electrical resistance. External electrical resistance is reduced because charges can travel between the metallic source material 104 and metallic drain material 106 through a continuously gated channel material 108 where there is no additional barrier height.

The vertical transistor 100 further includes a gate dielectric 112 between the 102C sidewall of the stack 102 and the gate electrode 110. The vertical transistor structure 100 further includes a gate metallization 114 over a first area of the stack directly adjacent to the gate dielectric layer 112, and in contact with a portion of the gate electrode 110 (not shown in cross-section). A drain metallization 116 is adjacent to the gate metallization 114, where the drain metallization 116 is over a second area of the stack 102, and in contact with the drain material 106. The drain metallization 116 is insulated from the gate metallization 114 by an insulator 118, and by the gate dielectric layer 112 to prevent electrical shorting. The vertical transistor further includes a second drain metallization 124 on a third region of the stack 102. The drain metallization 124 is insulated from the gate metallization 114 by an insulator 118, by the gate dielectric layer 112 and dielectric material 314. The gate metallization 114 is further coupled by a gate interconnect structure 128. The gate interconnect structure 128 is isolated from the drain metallization 116 and 124 by a dielectric material 322.

In the illustrative embodiment, the conductive interconnect 1422 is on and above with the source contact 1416. In the illustrative embodiment, one portion of the conductive interconnect 1422 is in electrical contact with a source material 104 of vertical transistor 100 through the substrate 101. In other embodiments, there are one or more additional interconnect structures between source material 104 and conductive interconnect 1422.

Gate contact 1412 and drain contact 1414 are each coupled with interconnects. In the illustrative embodiment, gate contact 1412 is coupled with a gate interconnect 1424 and the drain contact 1414 is coupled with a drain interconnect 1426. A dielectric 1426 is adjacent to drain interconnect 1426, gate interconnect 1424, source interconnect 1422, substrate 101, source contact 1416 and gate contact 1412 and drain contact 1414.

In an embodiment, the underlying substrate 1401 represents a surface used to manufacture integrated circuits. Suitable substrate 1401 includes a material such as single crystal silicon, polycrystalline silicon and silicon on insulator (SOI), as well as substrates formed of other semiconductor materials. In some embodiments, the substrate 1401 is the same as or substantially the same as the substrate 101. The substrate 1401 may also include semiconductor materials, metals, dielectrics, dopants, and other materials commonly found in semiconductor substrates.

In an embodiment, the transistor 1400 associated with substrate 1401 are metal-oxide-semiconductor field-effect transistors (MOSFET or simply MOS transistors), fabricated on the substrate 1401. In some embodiments, the transistor 1400 is an access transistor 1400. In various implementations of the disclosure, the transistor 1400 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In some embodiments, gate 1402 includes at least two layers, a gate dielectric layer 1402A and a gate electrode 1402B. The gate dielectric layer 1402A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1402A to improve its quality when a high-k material is used.

The gate electrode 1402B of the access transistor 1400 of substrate 1401 is formed on the gate dielectric layer 1402A and may consist of at least one P-type work function metal or N-type work function metal, depending on whether the transistor is to be a PMOS or an NMOS transistor. In some implementations, the gate electrode 1402B may consist of a stack of two or more metal layers, where one or more metal layers are work function metal layers and at least one metal layer is a conductive fill layer.

For a PMOS transistor, metals that may be used for the gate electrode 1402B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 1402B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 1402B may consist of one or more U-shaped metal layers formed atop one or more planar, non-U-shaped layers.

The sidewall spacers 1410 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 1404 and drain region 1406 are formed within the substrate adjacent to the gate stack of each MOS transistor. The source region 1404 and drain region 1406 are generally formed using either an implantation/diffusion process or an etching/deposition process. In the former process, dopants such as boron, aluminum, antimony, phosphorous, or arsenic may be ion-implanted into the substrate to form the source region 1404 and drain region 1406. An annealing process that activates the dopants and causes them to diffuse further into the substrate typically follows the ion implantation process. In the latter process, the substrate 1401 may first be etched to form recesses at the locations of the source and drain regions. An epitaxial deposition process may then be carried out to fill the recesses with material that is used to fabricate the source region 1404 and drain region 1406. In some implementations, the source region 1404 and drain region 1406 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 1404 and drain region 1406 may be formed using one or more alternate semiconductor materials such as germanium or a group III-V material or alloy. And in further embodiments, one or more layers of metal and/or metal alloys may be used to form the source region 1404 and drain region 1406.

In an embodiment, the source contact 1416, the drain contact 1414 and gate contact 1412 each include a liner layer and fill metal. In an embodiment, the liner layer includes Ti, Ru or Al and a conductive cap on the liner layer. The conductive cap may include a material such as W, Co or Cu.

In an embodiment, the source interconnect 1422 gate interconnect 1424, conductive interconnect drain interconnect 1426 includes a material that is the same or substantially the same as the material of the source contact 1416, gate contact 1412 or drain contact 1414. In one such embodiment, the fill metal includes copper.

The isolation 1408 and dielectric 1418 and 1426 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 15:
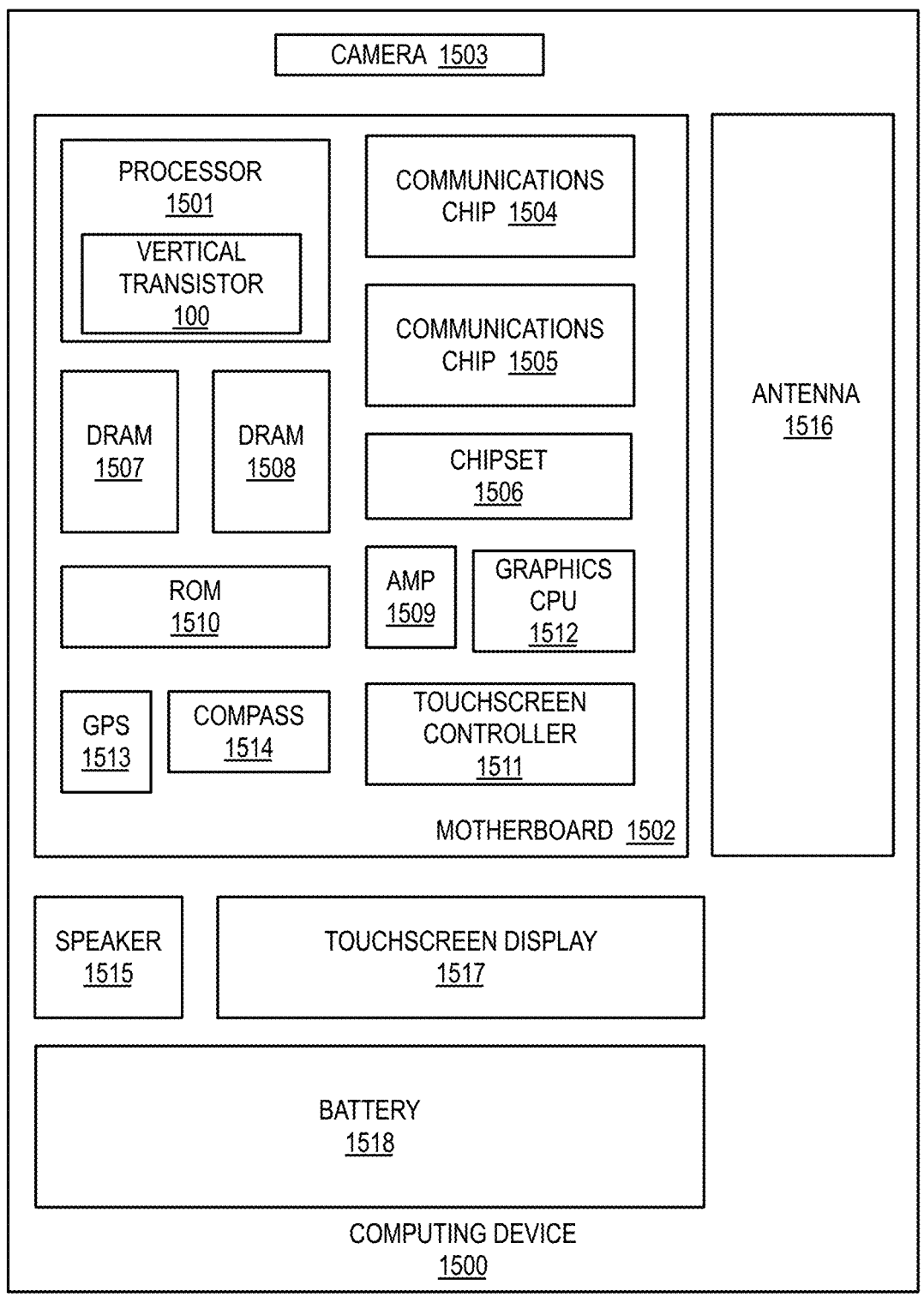
FIG. 15 illustrates a computing device in accordance with embodiments of the present disclosure.

FIG. 15 illustrates a computing device 1500 in accordance with embodiments of the present disclosure. As shown, computing device 1500 houses a motherboard 1502. Motherboard 1502 may include a number of components, including but not limited to a processor 1501 and at least one communications chip 1504 or 1505. Processor 1501 is physically and electrically coupled to the motherboard 1502. In some implementations, communications chip 1505 is also physically and electrically coupled to motherboard 1502. In further implementations, communications chip 1505 is part of processor 1501.

Depending on its applications, computing device 1500 may include other components that may or may not be physically and electrically coupled to motherboard 1502. These other components include, but are not limited to, volatile memory (e.g., DRAM), non-volatile memory (e.g., ROM), flash memory, a graphics processor, a digital signal processor, a crypto processor, a chipset 1506, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1505 enables wireless communications for the transfer of data to and from computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1505 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1500 may include a plurality of communications chips 1504 and 1505. For instance, a first communications chip 1505 may be dedicated to shorter range wireless communications such as Wi-Fi and Bluetooth and a second communications chip 1504 may be dedicated to longer range wireless communications such as GPS, EDGE, GPRS, CDMA, WiMAX, LTE, Ev-DO, and others.

Processor 1501 of the computing device 1500 includes an integrated circuit die packaged within processor 1501. In some embodiments, the integrated circuit die of processor 1501 includes one or more transistors such as vertical transistor 100 (described in association with FIGS. 1A-1E), interconnect structures, and non-volatile memory (NVM) devices such as magnetic tunnel junction and resistive random-access memory devices. The term "processor" may refer to any device or portion of a device that processes electronic data from registers and/or memory to transform that electronic data into other electronic data that may be stored in registers and/or memory.

Communications chip 1505 also includes an integrated circuit die packaged within communication chip 1505. In another embodiment, the integrated circuit die of communications chips 1504, 1505 includes one or more transistors such as vertical transistor 100 (described in association with FIGS. 1A-1E), interconnect structures, and non-volatile memory devices such as magnetic tunnel junction and resistive random-access memory devices. Depending on its applications, computing device 1500 may include other components that may or may not be physically and electrically coupled to motherboard 1502. These other components may include, but are not limited to, volatile memory (e.g., DRAM) 1507, 1508, non-volatile memory (e.g., ROM) 1510, a graphics CPU 1512, flash memory, global positioning system (GPS) device 1513, compass 1514, a chipset 1506, an antenna 1516, a power amplifier 1509, a touchscreen controller 1511, a touchscreen display 1517, a speaker 1515, a camera 1503, and a battery 1518, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1500 and discussed above may contain a stand-alone integrated circuit memory die that includes one or more arrays of NVM devices coupled with a vertical transistor 100 (described in association with FIGS. 1A-1E). In an embodiment, the NVM devices may include spintronics-based devices, magnetic tunnel junction devices, or resistive random-access devices. In other embodiments two or three terminal spin orbit torque memory devices may be coupled with one or more vertical transistors such as vertical transistor 100 (described in association with FIGS. 1A-1E).

In various implementations, the computing device 1500 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1500 may be any other electronic device that processes data.

Figure 16:
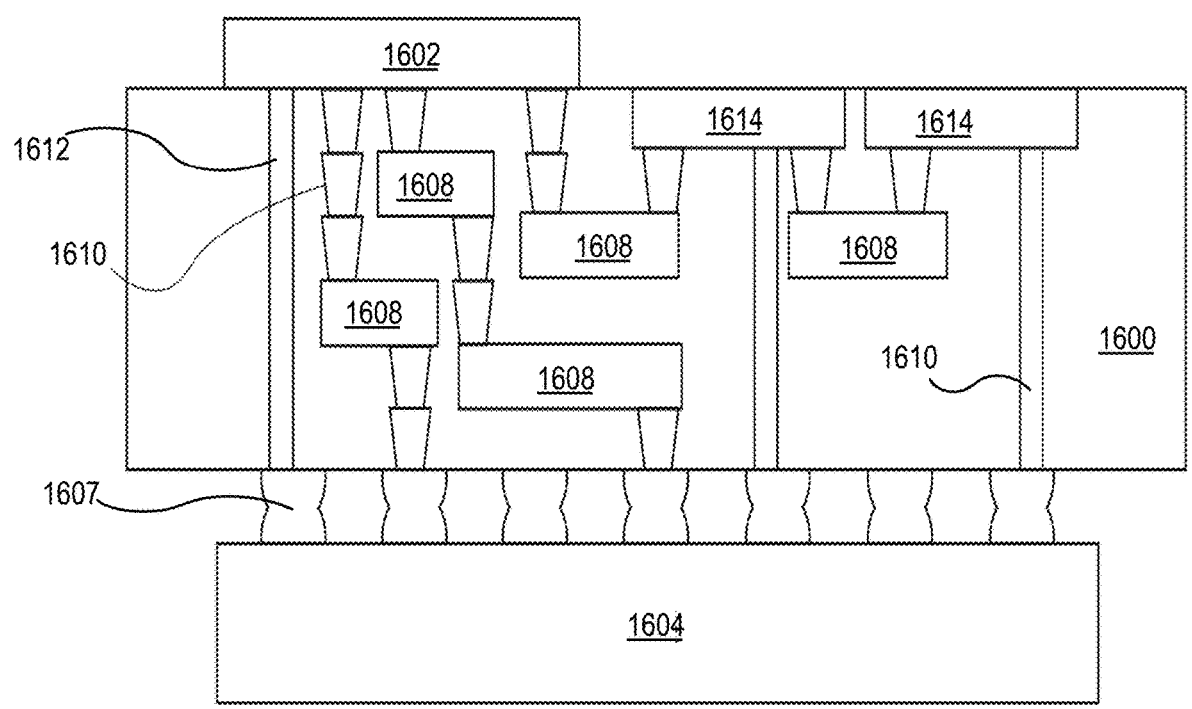
FIG. 16 illustrates an integrated circuit (IC) structure that includes one or more embodiments of the present disclosure.

FIG. 16 illustrates an integrated circuit (IC) structure 1600 that includes one or more embodiments of the disclosure. The integrated circuit (IC) structure 1600 is an intervening substrate used to bridge a first substrate 1602 to a second substrate 1604. The first substrate 1602 may be, for instance, an integrated circuit die. The second substrate 1604 may be, for instance, a memory module, a computer mother, or another integrated circuit die. Generally, the purpose of an integrated circuit (IC) structure 1600 is to spread a connection to a wider pitch or to reroute a connection to a different connection. For example, an integrated circuit (IC) structure 1600 may couple an integrated circuit die to a ball grid array (BGA) 1607 that can subsequently be coupled to the second substrate 1604. In some embodiments, the first and second substrates 1602/1604 are attached to opposing sides of the integrated circuit (IC) structure 1600. In other embodiments, the first and second substrates 1602/1604 are attached to the same side of the integrated circuit (IC) structure 1600. And in further embodiments, three or more substrates are interconnected by way of the integrated circuit (IC) structure 1600.

The integrated circuit (IC) structure 1600 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1608 and vias 1610, including but not limited to through-silicon vias (TSVs) 1612. The integrated circuit (IC) structure 1600 may further include embedded devices 1614, including both passive and active devices. Such embedded devices 1614 include capacitors, decoupling capacitors, resistors, inductors, fuses, diodes, transformers, device structure including transistors, such as vertical transistor 100 and vertical transistor 100 coupled with a with one at least one nonvolatile memory device such as memory device such as a magnetic tunnel junction or a resistive random access memory device. The integrated circuit (IC) structure 1600 may further include embedded devices 1614 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1600. In accordance with embodiments of the present disclosure, apparatuses or processes disclosed herein may be used in the fabrication of integrated circuit (IC) structure 1600.

Accordingly, one or more embodiments of the present disclosure relate generally to the fabrication of vertical transistor. The microelectronic memory may include an amorphous or polycrystalline channel material. One or more embodiments of the present disclosure relate to the fabrication of a vertical transistor such as the vertical transistor 100. The vertical transistor 100 may be used in variety of microelectronic logic and memory applications.

In a first example, a vertical transistor structure includes a material stack having, a source material, a drain material, and a channel material therebetween. The vertical transistor structure further includes a gate electrode adjacent to a sidewall of the stack, where the sidewall includes the channel material, and at least a partial thickness of both the source material and the drain material. A gate dielectric is present between the sidewall of the stack and the gate electrode. The vertical transistor structure further includes a first metallization over a first area of the stack above the gate dielectric layer, and in contact with the gate electrode on sidewall of the stack. A second metallization is adjacent to the first metallization, where the second metallization is over a second area of the stack, and in contact with the source material or the drain material.

In second examples, for any of the first example, the channel material includes an amorphous or polycrystalline semiconductor.

In third examples, for any of the first through second examples, the channel material includes IGZO, ZnO, In2O3, ITO, IZO, CuOx, SnOx, Si, Ge, SiGe, InSe, InS, ZnS, ZnSe, MoSe, MoS, CuS, CuSe, HfS, HfSe, ZrS, ZrSe, AlS, AlS ZnN, black phosphorus, graphene.

In fourth examples, for any of the first through third examples, source material and the drain material comprise a metal, an alloy, heavily doped semiconductor material or a conductive oxide and have a higher electrical conductivity than the channel material.

In fifth examples, for any of the first through fourth examples, the sidewall is a first sidewall and the material layer stack further includes a second sidewall opposite to the first sidewall, and wherein the gate dielectric layer is adjacent to the second sidewall and the gate electrode is adjacent to the gate dielectric layer on the second sidewall.

In sixth examples, for any of the first through fifth examples, the first metallization is in contact with the gate electrode adjacent to the gate dielectric layer on the second sidewall.

In seventh examples, for any of the first through sixth examples, the gate electrode overlaps at least 80% of the first conductive material.

In eighth examples, for any of the first through seventh examples, the gate electrode overlaps between 50% and 75% of the drain material.

In ninth examples, for any of the first through eighth examples, the vertical transistor further comprises an insulator on a portion of the source or the drain material in the first area.

In tenth examples, for any of the first through ninth examples, the insulator has an uppermost surface and a sidewall substantially coplanar with the sidewall of the material stack and wherein the gate dielectric is on the sidewall of the insulator and on the uppermost surface.

In eleventh examples, for any of the first through tenth examples, the gate dielectric is between the gate metallization and the insulator.

In twelfth examples, for any of the first through eleventh examples, the drain metallization is in contact with the gate dielectric.

In thirteenth examples, for any of the first through twelfth examples, the source material includes nitrogen and least one of titanium or tantalum, tungsten, ruthenium or cobalt, or oxygen and one or more of tin, zinc, iridium, ruthenium, indium, and the drain material includes nitrogen and least one of titanium or tantalum, tungsten, ruthenium or cobalt, or oxygen and one or more of tin, zinc, iridium, ruthenium, indium.

In fourteenth examples, for any of the first through thirteenth examples, the source material has a thickness between 5 nm and 100 nm, the source material has a thickness between 5 nm and 100 nm and the channel material has a thickness of at least 5 nm.

In fifteenth examples, for any of the first through fourteenth examples, the gate dielectric layer has a thickness between 1 nm and 20 nm.

In sixteenth examples, for any of the first through fifteenth examples, the vertical transistor further includes a third metallization over a third area of the stack opposite to the second area, the third metallization in contact with the source material or the drain material.

In a seventeenth example, an integrated circuit structure includes a first region. The first region includes a MOS transistor having a single crystal semiconductor and at least one conductive interconnect coupled with the MOS transistor. The integrated circuit structure further includes a second region above to the first region, the second region, includes a vertical transistor coupled with the conductive interconnect. The vertical transistor structure includes a material stack having, a source material, a drain material, and a channel material therebetween. The vertical transistor structure further includes a gate electrode adjacent to a sidewall of the stack, where the sidewall includes the channel material, and at least a partial thickness of both the source material and the drain material. A gate dielectric is present between the sidewall of the stack and the gate electrode. The vertical transistor structure further includes a first metallization over a first area of the stack above the gate dielectric layer, and in contact with the gate electrode on sidewall of the stack. A second metallization is adjacent to the first metallization, where the second metallization is over a second area of the stack, and in contact with the source material or the drain material.

In eighteenth examples, for any of the seventeenth example, the channel material includes IGZO, ZnO, In2O3, ITO, IZO, CuOx, SnOx, Si, Ge, SiGe, InSe, InS, ZnS, ZnSe, MoSe, MoS, CuS, CuSe, HfS, HfSe, ZrS, ZrSe, AlS, AlS ZnN, black phosphorus, graphene.

In a nineteenth example, a method of fabricating a transistor includes forming a material layer stack, where the forming includes depositing a first conductive layer above a substrate and depositing a semiconductor material on the first conductive layer. The method further includes depositing a second conductive layer semiconductor material and patterning the material layer stack to form a block having sidewalls. The method further includes depositing a gate dielectric layer on the block, on sidewalls of the block and on the substrate and blanket depositing a gate electrode material on the gate dielectric layer and patterning the gate electrode material to form a gate electrode adjacent to the gate dielectric and overlapping sidewalls of the block. The method further includes forming a gate contact on a portion of the gate electrode and forming a metallization structure on a portion of the second conductive layer by removing portions of the gate dielectric layer.

In twentieth examples, for any of the nineteenth example, patterning the gate electrode material includes recessing an uppermost surface of the gate electrode below an uppermost surface of the block.

What is claimed is:
1. An apparatus, comprising:
   a material stack in a vertical transistor structure, the material stack comprising a source material, a drain material, and a channel material therebetween;
   a gate electrode adjacent to a sidewall of the material stack, the sidewall comprising the channel material and at least a partial thickness of both the source material and the drain material;
   a gate dielectric between the sidewall of the material stack and the gate electrode;
   a first metallization over a first area of the material stack and in contact with the gate electrode, wherein the gate electrode is between the first metallization and the gate dielectric; and
   a second metallization adjacent to the first metallization, the second metallization over a second area of the material stack and in contact with the source material or the drain material.

2. The apparatus of claim 1, wherein the sidewall is a first sidewall, and the material stack further comprises a second sidewall opposite to the first sidewall, and wherein the gate dielectric is adjacent to the second sidewall, and the gate electrode is adjacent to the gate dielectric on the second sidewall.

3. The apparatus of claim 2, wherein the first metallization is in contact with the gate electrode adjacent to the gate dielectric on the second sidewall.

4. The apparatus of claim 1, further comprising an insulator on a portion of the source or drain material in the first area.

5. The apparatus of claim 4, wherein the insulator has an uppermost surface and a sidewall substantially coplanar with the sidewall of the material stack and wherein the gate dielectric is on the sidewall of the insulator and on the uppermost surface.

6. The apparatus of claim 5, wherein the gate dielectric is between the first metallization and the insulator.

7. The apparatus of claim 1, wherein the second metallization is in contact with the gate dielectric.

8. The apparatus of claim 1, further comprising a third metallization over a third area of the material stack on a side of the first metallization opposite of the second area, wherein the second metallization is in contact with a first of the source material or the drain material, and the third metallization is in contact with the first of the source material or the drain material.

9. An apparatus, comprising:
   a first region in an integrated circuit structure, the first region comprising:
      a MOS transistor, comprising a single crystal semiconductor; and
      a conductive interconnect coupled with the MOS transistor; and
   a second region in the integrated circuit structure, above the first region, the second region comprising:
   a vertical transistor coupled with the conductive interconnect, the vertical transistor comprising:
      a material stack, comprising a source material, a drain material, and a channel material therebetween;
      a gate electrode adjacent to a sidewall of the material stack, the sidewall comprising the channel material and at least a partial thickness of both the source material and the drain material;
      a gate dielectric between the sidewall of the material stack and the gate electrode;
      a first metallization over a first area of the material stack and in contact with the gate electrode; and
      a second metallization adjacent to the first metallization, the second metallization over a second area of the material stack and in contact with the source material or the drain material.

10. The apparatus of claim 9, wherein the channel material comprises an amorphous or polycrystalline semiconductor, indium gallium zinc oxide, zinc oxide, indium oxide, indium tin oxide, indium zinc oxide, copper oxide, tin oxide, Si, Ge, SiGe, InSe, InS, ZnS, ZnSe, MoSe, MoS, CuS, CuSe, HfS, HfSe, ZrS, ZrSe, AlS, AlS, ZnN, black phosphorus, or graphene.

11. The apparatus of claim 9, wherein the gate electrode is between the first metallization and the gate dielectric.

12. The apparatus of claim 9, wherein the first metallization is in direct contact with a sidewall of the gate electrode.

13. An apparatus, comprising:
   a material stack in a vertical transistor structure, comprising a source material, a drain material, and a channel material therebetween;
   a gate electrode adjacent to a sidewall of the material stack, the sidewall comprising the channel material and at least a partial thickness of both the source material and the drain material;
   a gate dielectric between the sidewall of the material stack and the gate electrode;
   a first metallization over a first area of the material stack and in direct contact with the gate electrode; and
   a second metallization adjacent to the first metallization, the second metallization over a second area of the material stack and in direct contact with the source material or the drain material.

14. The apparatus of claim 13, wherein the first metallization is in direct contact with a sidewall of the gate electrode.

15. The apparatus of claim 13, wherein the sidewall is a first sidewall, and the material stack further comprises a second sidewall opposite to the first sidewall, and wherein the gate dielectric is adjacent to the second sidewall, and the gate electrode is adjacent to the gate dielectric on the second sidewall.

16. The apparatus of claim 15, wherein the first metallization is in direct contact with the gate electrode adjacent to the gate dielectric on the second sidewall.

17. The apparatus of claim 13, further comprising an insulator on a portion of the source or drain material in the first area, wherein the insulator has an uppermost surface and a sidewall, the sidewall of the insulator is substantially coplanar with the sidewall of the material stack, and the gate dielectric is on the sidewall of the insulator and on the uppermost surface.

18. The apparatus of claim 17, wherein the gate dielectric is between the first metallization and the insulator.

19. The apparatus of claim 13, wherein the gate electrode laterally surrounds the material stack.

20. The apparatus of claim 13, further comprising a third metallization over a third area of the material stack on a side of the first metallization opposite of the second area, wherein the second metallization is in direct contact with a first of the source material or the drain material, and the third metallization is in direct contact with the first of the source material or the drain material.

* * * * *